US010355908B1

(12) United States Patent
Peyla et al.

(10) Patent No.: US 10,355,908 B1
(45) Date of Patent: Jul. 16, 2019

(54) CSI ESTIMATION AND LLR APPROXIMATION FOR QAM DEMODULATION IN FM HD RADIO RECEIVERS

(71) Applicant: Ibiquity Digital Corporation, Columbia, MD (US)

(72) Inventors: Paul J. Peyla, Elkridge, MD (US); Brian W. Kroeger, Sykesville, MD (US)

(73) Assignee: Ibiquity Digital Corporation, Columbia, MD (US)

( * ) Notice: Subject to any disclaimer, the term of this patent is extended or adjusted under 35 U.S.C. 154(b) by 0 days.

(21) Appl. No.: 15/913,191

(22) Filed: Mar. 6, 2018

(51) Int. Cl.
  H04L 1/00 (2006.01)
  H04L 27/38 (2006.01)
  H04L 25/06 (2006.01)
  H03M 13/45 (2006.01)
  H03M 13/39 (2006.01)
  H03M 13/11 (2006.01)

(52) U.S. Cl.
  CPC ............ *H04L 27/38* (2013.01); *H04L 1/0054* (2013.01); *H03M 13/1111* (2013.01); *H03M 13/3927* (2013.01); *H03M 13/45* (2013.01); *H04L 25/067* (2013.01)

(58) Field of Classification Search
  CPC ............... H04L 25/067; H04L 1/0045; H03M 13/2957; H03M 13/1111; H03M 13/3927; H03M 13/45; H03M 13/6594
  See application file for complete search history.

(56) References Cited

U.S. PATENT DOCUMENTS

| 7,933,368 | B2 | 4/2011 | Peyla et al. | |
|---|---|---|---|---|
| 9,106,472 | B1* | 8/2015 | Kroeger | H04L 25/06 |
| 2003/0212946 | A1* | 11/2003 | Kroeger | H03M 13/25 |
| | | | | 714/786 |
| 2004/0181744 | A1* | 9/2004 | Sindhushayana | H03M 13/2957 |
| | | | | 714/794 |
| 2008/0291819 | A1* | 11/2008 | Gho | H04L 1/0045 |
| | | | | 370/208 |

(Continued)

OTHER PUBLICATIONS

"International Application Serial No. PCT/US2019/020714, International Search Report dated Apr. 3, 2019", 2 pgs.

(Continued)

*Primary Examiner* — Ross Varndell
(74) *Attorney, Agent, or Firm* — Schwegman Lundberg & Woessner, P.A.

(57) ABSTRACT

A radio receiver comprises physical layer circuitry and processor circuitry. The physical layer circuitry receives quadrature amplitude modulation (QAM) symbols via a plurality of subcarriers included in a broadcast radio signal. Each received QAM symbol is a complex symbol comprising multiple bits of encoded source information. The processing circuitry demodulates the received data symbols, generates a constellation sample for each received QAM symbol, generates a soft metric for each bit of encoded information of the received QAM symbols using the constellation sample, and multiplies the soft metric by a channel state information (CSI) weight to produce a Log-likelihood Ratio (LLR) approximation for each bit of encoded information of the received QAM symbols.

20 Claims, 16 Drawing Sheets

(56) References Cited

U.S. PATENT DOCUMENTS

2009/0060078 A1* 3/2009 van Zelst .................. H04L 1/06
375/262
2016/0226528 A1* 8/2016 Serbetli ............. H03M 13/6502

OTHER PUBLICATIONS

"International Application Serial No. PCT/US2019/020714, Written Opinion dated Apr. 3, 2019,", 7 pgs.

* cited by examiner

CSI ESTIMATION AND LLR
APPROXIMATION FOR QAM
DEMODULATION IN FM HD RADIO
RECEIVERS

TECHNICAL FIELD

The technology described in this document relates to devices and methods for receiving and processing in-band on-channel (IBOC) radio signals, and more particularly, to devices and methods for estimating channel state information and approximating log-likelihood ratio metrics.

BACKGROUND

The iBiquity Digital Corporation HID Radio™ system is designed to permit a smooth evolution from current analog amplitude modulation (AM) and frequency modulation (FM) radio systems to an in-band on-channel (IBOC) system. An IBOC system can deliver digital audio and data services to mobile, portable, and fixed receivers from terrestrial transmitters in the existing medium frequency (MF) and very high frequency (VHF) radio bands.

IBOC signals can be transmitted in a hybrid format that includes an analog modulated carrier in combination with a plurality of digitally modulated subcarriers, or in an all-digital format in which an analog modulated carrier is not used. Using the hybrid format, broadcasters may continue to transmit analog AM and FM simultaneously with higher-quality and more robust digital signals, allowing themselves and their listeners to convert from analog to digital radio while maintaining their current frequency allocations. IBOC hybrid and all-digital waveforms are described in U.S. Pat. No. 7,933,368, which is incorporated by reference herein in its entirety.

Channel State Information (CSI) is useful in the decoding of digital signals in radio receivers. CSI as a signal-to-noise ratio (SNR) conveys the reliability of the associated digital symbols, while the estimation of complex channel gain and noise allows the demodulator to remove channel effects or compensate for them. Accurate CSI estimation can be important to reliably approximate Log-Likelihood Ratio (LLR) metrics and maximize reliable decoding performance. It is desirable to improve accuracy of CSI estimation for IBOC radio receivers.

SUMMARY

The technology presented in this document relates to improvements in determining channel state information and approximating LLR metrics of radio broadcast signals.

A radio receiver example includes physical layer circuitry and processor circuitry. The physical layer circuitry receives quadrature amplitude modulation (QAM) symbols via a plurality of subcarriers included in a broadcast radio signal. Each received QAM symbol is a complex symbol comprising multiple bits of encoded source information. The processing circuitry demodulates the received data symbols, generates a constellation sample for each received QAM symbol, generates a soft metric for each bit of encoded information of the received QAM symbols using the constellation sample, and multiplies the soft metric by a CSI weight to produce an LLR approximation for each bit of encoded information of the received QAM symbols.

A method example generates LLR approximations from a broadcast radio signal using CSI estimates. The method example includes receiving QAM symbols via subcarriers of the broadcast radio signal and demodulating the QAM symbols, wherein each received QAM symbol is a complex symbol comprising multiple bits of encoded source information; generating a constellation sample for each received QAM symbol; generating a soft metric for each bit of encoded information in the received QAM symbols using the constellation sample; and multiplying the soft metric by a CSI weight to produce an LLR approximation for each bit of encoded information in the received QAM symbols.

There continues to be demand for increased bandwidth for subcarriers or sidebands of hybrid, extended-hybrid, or all-digital IBOC radio signals. Improved estimates of the channel state information for QAM signals can lead to increased capacity of the sidebands.

This section is intended to provide a brief overview of subject matter of the present patent application. It is not intended to provide an exclusive or exhaustive explanation of the invention. The detailed description is included to provide further information about the present patent application such as a discussion of the dependent claims and the interrelation of the dependent and independent claims in addition to the statements made in this section.

DESCRIPTION

The following description describes various embodiments of methods and apparatus that provide improved Channel State Information (CSI) estimation and Log-Likelihood Ratio (LLR) approximations for Orthogonal Frequency Division Multiplexing (OFDM) Quadrature Amplitude Modulated (QAM) signals of IBOC radio systems. Improvements include correcting for bias error in estimation of channel gain and noise variance. These improvements can provide increased capacity and robustness for subcarriers of an IBOC radio signal.

IBOC Signaling

Figure 1:
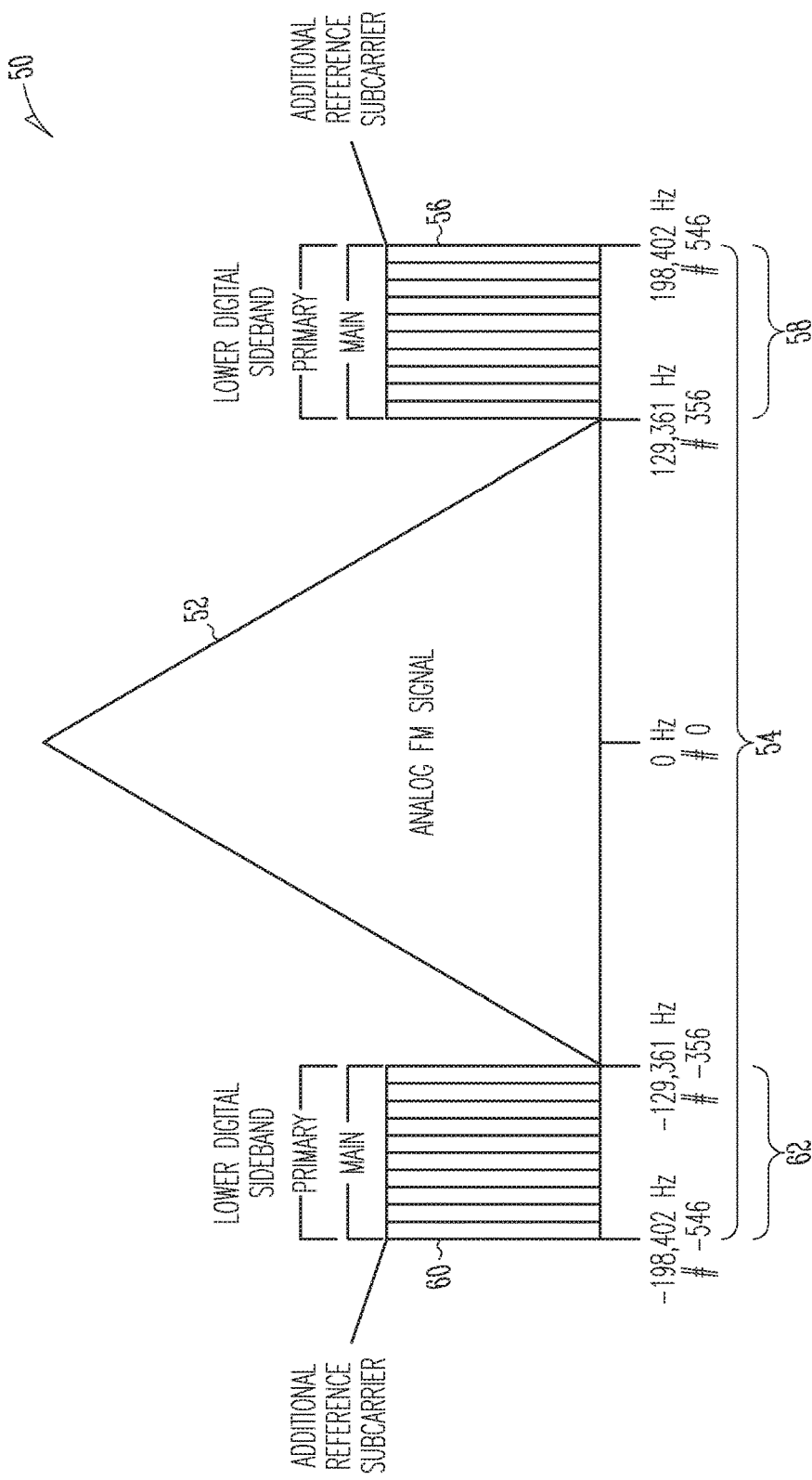
FIG. 1 is a schematic representation of the spectrum of the hybrid frequency modulation (FM) in-band on-channel (IBOC) waveform.

FIG. 1 is a schematic representation of the spectrum of the hybrid FM IBOC waveform 50 to which the methods described herein can be applied. The waveform includes an analog modulated signal 52 located in the center of a broadcast channel 54, a first set of multiple evenly spaced orthogonally frequency division multiplexed subcarriers 56 in an upper sideband 58, and a second set of multiple evenly spaced orthogonally frequency division multiplexed subcarriers 60 in a lower sideband 62. The digitally modulated subcarriers are broadcast at a lower power level than the analog modulated carrier to comply with required channel signal masks. The digitally modulated subcarriers are divided into partitions and various subcarriers are designated as reference subcarriers. A frequency partition is a group of 19 OFDM subcarriers containing 18 data subcarriers and one reference subcarrier.

The subcarriers are located at evenly spaced frequency locations. The subcarrier locations are numbered from −546 to +546. In the waveform of FIG. 1, the subcarriers are at locations +356 to +546 and −356 to −546. This waveform may be used during an initial transitional phase preceding conversion to the all-digital waveform.

Each primary main sideband is comprised of ten frequency partitions, which are allocated among subcarriers 356 through 545, or −356 through −545. Subcarriers 546 and −546, also included in the primary main sidebands, are additional reference subcarriers. The amplitude of each subcarrier can be scaled by an amplitude scale factor.

In the hybrid waveform, the digital signal is transmitted in Primary Main (PM) sidebands on either side of the analog FM signal. The power level of each sideband is appreciably below the total power in the analog FM signal. The analog signal may be monophonic or stereo, and may include subsidiary communications authorization (SCA) channels.

Figure 2:
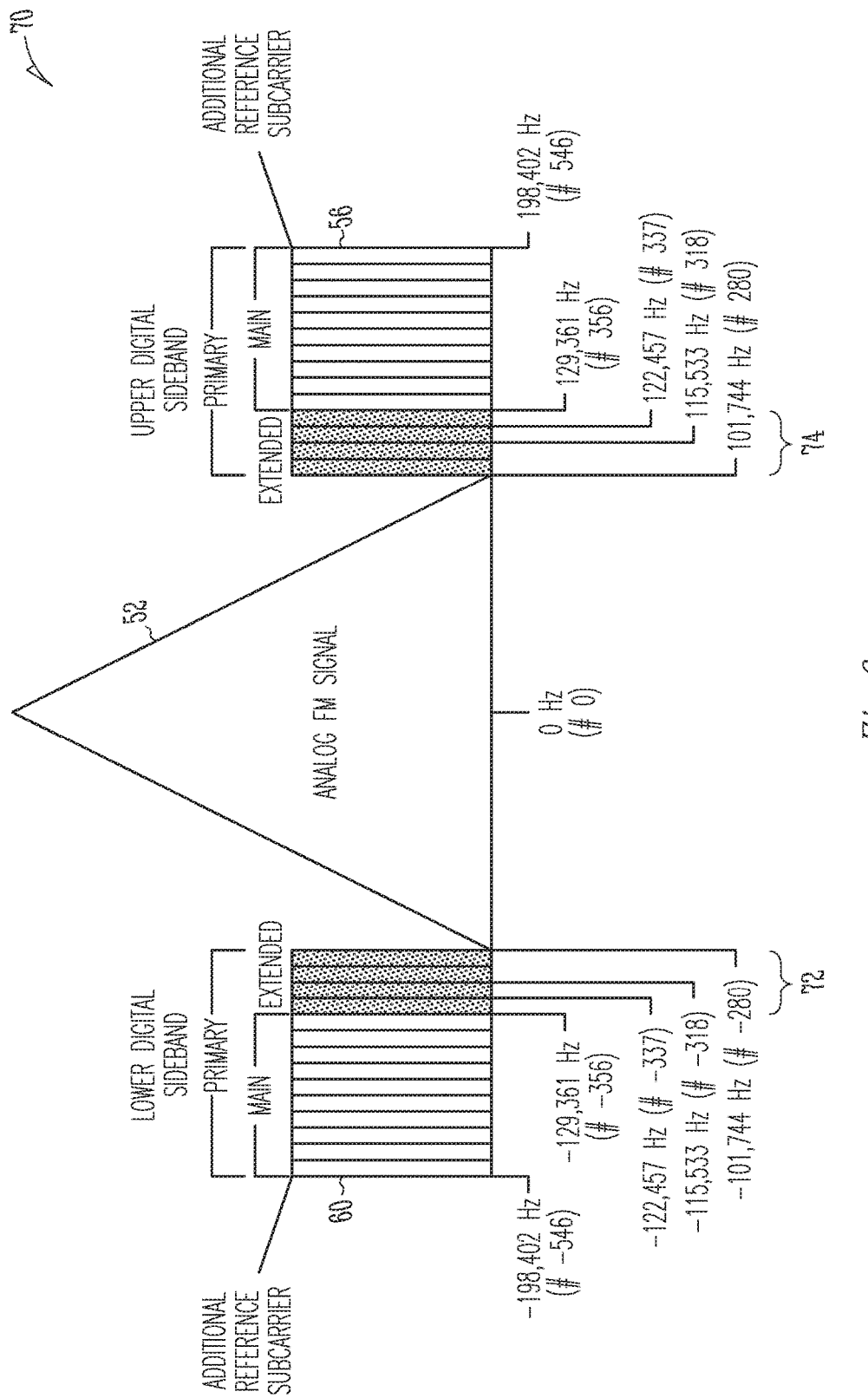
FIG. 2 is a schematic representation of an extended hybrid FM IBOC waveform.

FIG. 2 is a schematic representation of an extended hybrid FM IBOC waveform 70. The extended hybrid waveform is created by adding primary extended sidebands 72, 74 to the primary main sidebands present in the hybrid waveform. This additional spectrum, allocated to the inner edge of each Primary Main sideband, is termed the Primary Extended (PX) sideband. Depending on the service mode, one, two, or four frequency partitions can be added to the inner edge of each primary main sideband.

The extended hybrid waveform includes the analog FM signal plus digitally modulated primary main subcarriers (subcarriers +356 to +546 and −356 to −546) and some or all primary extended subcarriers (subcarriers +280 to +355 and −280 to −355). This waveform can be used during an initial transitional phase preceding conversion to the all-digital waveform.

Each primary main sideband includes ten frequency partitions and an additional reference subcarrier spanning subcarriers 356 through 546, or −356 through −546. The upper primary extended sidebands include subcarriers 337 through 355 (one frequency partition), 318 through 355 (two frequency partitions), or 280 through 355 (four frequency partitions). The lower primary extended sidebands include subcarriers −337 through −355 (one frequency partition), −318 through −355 (two frequency partitions), or −280 through −355 (four frequency partitions). The amplitude of each subcarrier can be scaled by an amplitude scale factor.

Figure 3:
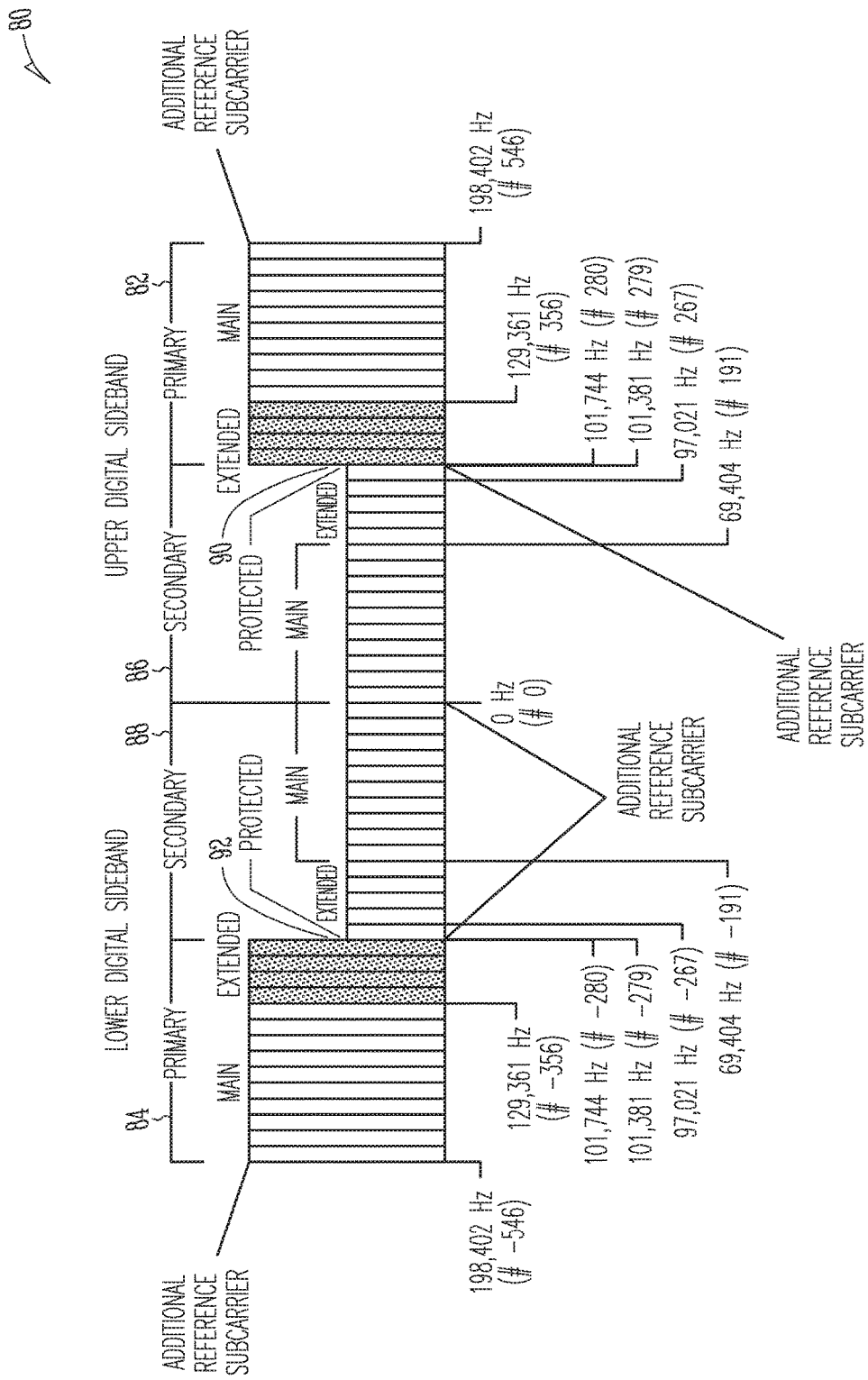
FIG. 3 is a schematic representation of the spectrum of an all-digital FM IBOC waveform.

FIG. 3 is a schematic representation of the spectrum of the all-digital FM waveform to which this invention can be applied. FIG. 3 is a schematic representation of an all-digital FM IBOC waveform 80. The all-digital waveform is constructed by disabling the analog signal, fully expanding the bandwidth of the primary digital sidebands 82, 84, and adding lower-power secondary sidebands 86, 88 in the spectrum vacated by the analog signal. The all-digital waveform in the illustrated embodiment includes digitally modulated subcarriers at subcarrier locations −546 to +546, without an analog FM signal.

In addition to the ten main frequency partitions, all four extended frequency partitions are present in each primary sideband of the all-digital waveform. Each secondary sideband also has ten Secondary Main (SM) and four Secondary Extended (SX) frequency partitions. Unlike the primary sidebands, however, the Secondary Main frequency partitions are mapped nearer to channel center with the extended frequency partitions farther from the center.

Each secondary sideband also supports a small Secondary Protected (SP) region 90, 92 including 12 OFDM subcarriers and reference subcarriers 279 and −279. The sidebands are referred to as "protected" because they are located in the area of spectrum least likely to be affected by analog or digital interference. An additional reference subcarrier is placed at the center of the channel (0). Frequency partition ordering of the SP region does not apply since the SP region does not contain frequency partitions.

Each Secondary Main sideband spans subcarriers 1 through 190 or −1 through −190). The upper Secondary Extended sideband includes subcarriers 191 through 266, and the upper Secondary Protected sideband includes subcarriers 267 through 278, plus additional reference subcarrier 279. The lower Secondary Extended sideband includes subcarriers −191 through −266, and the lower Secondary Protected sideband includes subcarriers −267 through −278, plus additional reference subcarrier −279. The total frequency span of the entire all-digital spectrum is 396,803 Hz. The amplitude of each subcarrier can be scaled by an amplitude scale factor. The secondary sideband amplitude scale factors can be user selectable. Any one of the four may be selected for application to the secondary sidebands.

All three waveform types conform to the currently allocated spectral emissions mask. The digital signal is modulated using orthogonal frequency division multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

Figure 4:
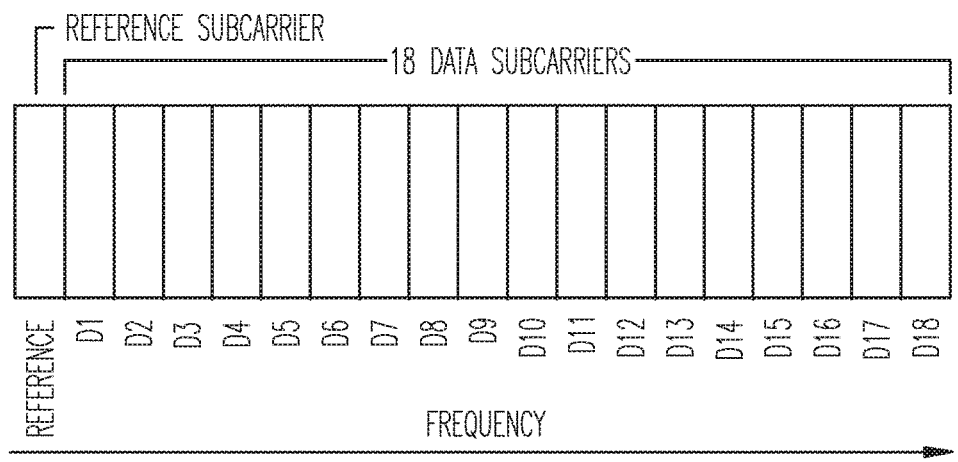
FIG. 4 is a schematic representation of a type of Frequency-Partition Ordering.
Figure 5:
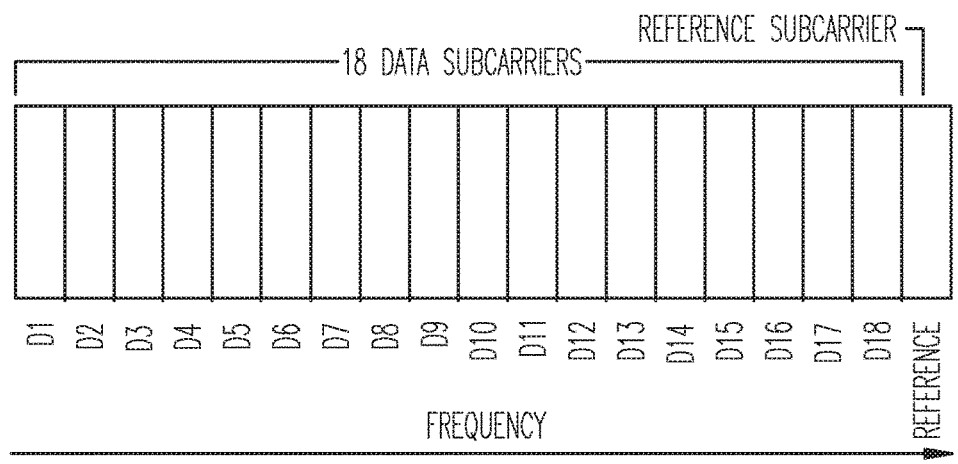
FIG. 5 is a schematic representation of another type of Frequency-Partition Ordering.

The OFDM subcarriers are assembled into frequency partitions. FIG. 4 is a schematic representation of a first type of Frequency-Partition Ordering. FIG. 5 is a schematic representation of a second type of Frequency-Partition Ordering. Each frequency partition consists of eighteen data subcarriers and one reference subcarrier, as shown in FIG. 4 (ordering A) and FIG. 5 (ordering B). The position of the reference subcarrier (ordering A or B) varies with the location of the frequency partition within the spectrum.

Figure 6:
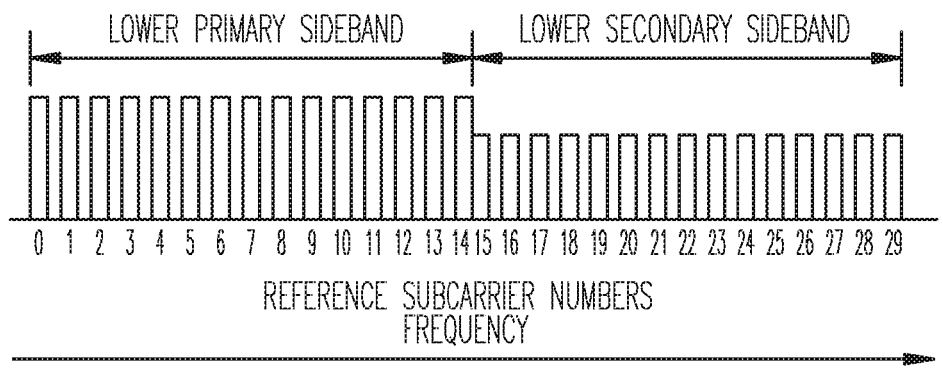
FIG. 6 is a schematic representation of lower sideband reference subcarriers.
Figure 7:
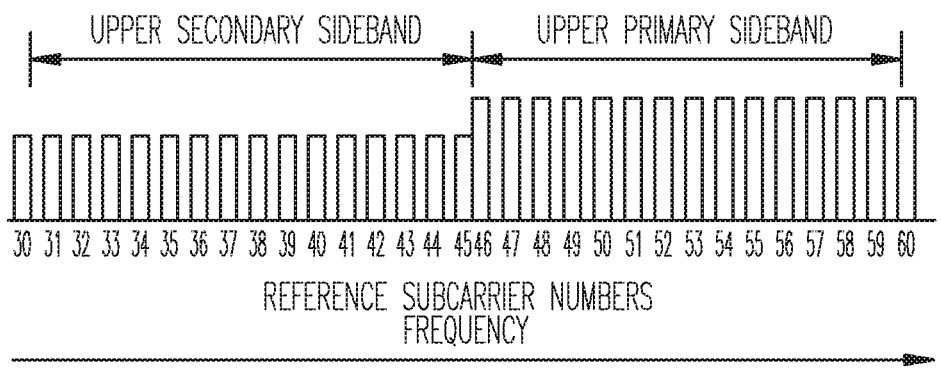
FIG. 7 is a schematic representation of upper sideband reference subcarriers.

Besides the reference subcarriers resident within each frequency partition, depending on the service mode, up to five additional reference subcarriers are inserted into the spectrum at subcarrier numbers −546, −279, 0, 279, and 546. The overall effect is a regular distribution of reference subcarriers throughout the spectrum. For notational convenience, each reference subcarrier is assigned a unique identification number between 0 and 60. All lower sideband reference subcarriers are shown in FIG. 6. All upper sideband reference subcarriers are shown in FIG. 7.

FIGS. 1-3 show the subcarrier number and center frequency of certain key OFDM subcarriers. The center frequency of a subcarrier is calculated by multiplying the subcarrier number by the OFDM subcarrier spacing $\Delta f$. The center of subcarrier 0 is located at 0 Hz. In this context, center frequency is relative to the Radio Frequency (RF) allocated channel. For example, the upper Primary Main sideband is bounded by subcarriers 356 and 546, whose center frequencies are located at 129,361 Hz and 198,402 Hz, respectively. The frequency span of the Primary Main sideband is 69,041 Hz (198,402-129,361).

Figure 8:
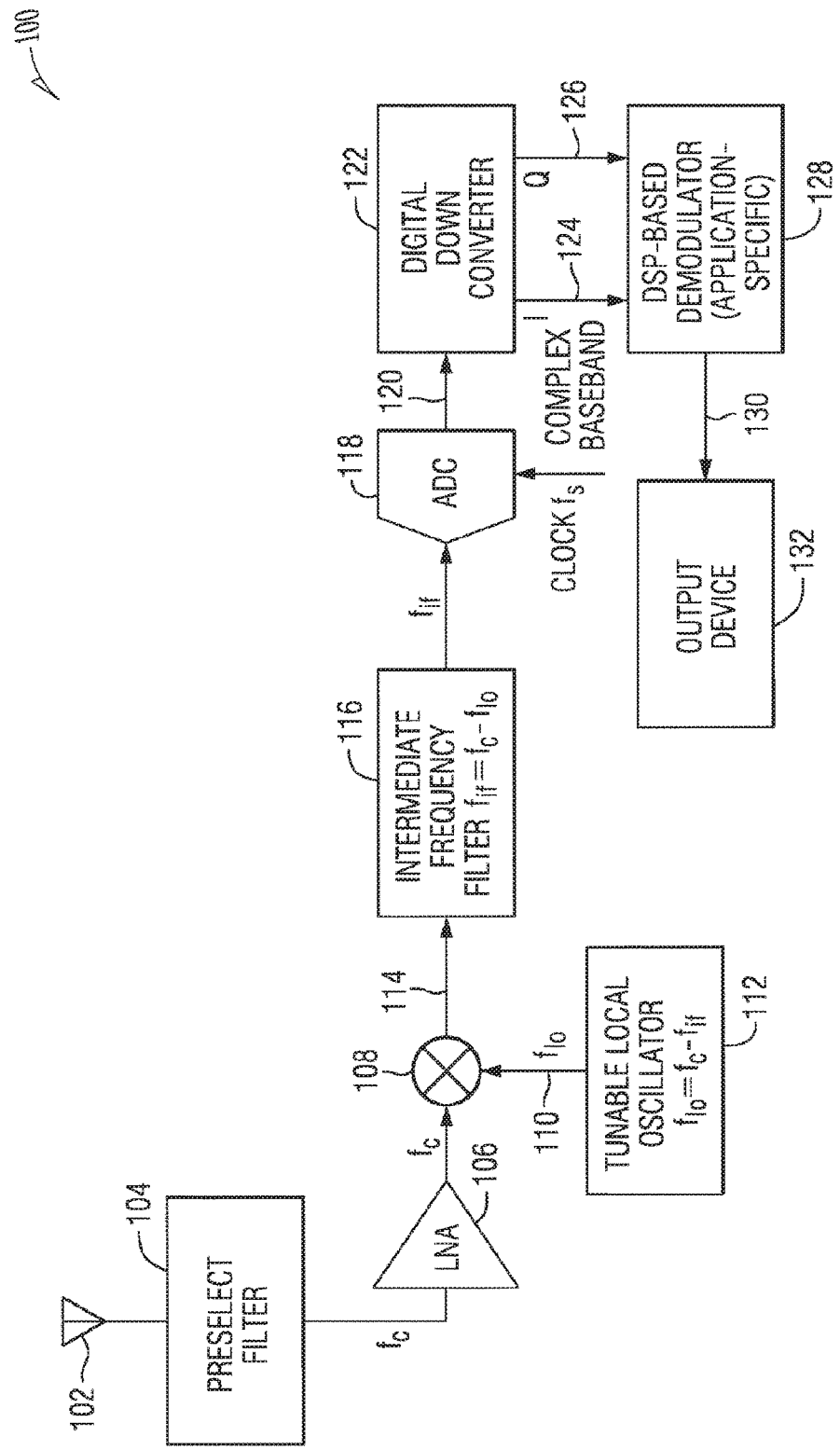
FIG. 8 is a block diagram of portions of an example of a radio receiver.

FIG. 8 is a block diagram of portions of an example of a receiver 100 that can process IBOC radio signals in accordance with an embodiment of this invention. In the example, an IBOC radio signal is received on antenna 102. A bandpass preselect filter 104 passes the frequency band of interest, including the desired signal at frequency $f_c$, but rejects the image signal at $(fc-2f_{if})$ (for a low sideband injection local oscillator). Low noise amplifier 106 amplifies the signal. The amplified signal is mixed in mixer 108 with a local oscillator signal $f_{lo}$ supplied on line 110 by a tunable local oscillator 112. This creates sum $(f_c+f_{lo})$ and difference $(f_c-f_{lo})$ signals on line 114. Intermediate frequency filter 116 passes the intermediate frequency (IF) signal $f_{if}$ and attenuates frequencies outside of the bandwidth of the modulated signal of interest. An analog-to-digital converter 118 operates using a clock signal $f_s$ to produce digital samples on line 120 at a rate $f_s$. Digital down converter 122 frequency shifts, filters and decimates the signal to produce lower sample rate in-phase and quadrature signals on lines 124 and 126. Processing circuitry, such as digital signal processor 128 or other type of processor, then provides additional signal processing to produce an output signal on line 130 for output device 132.

Figure 9:
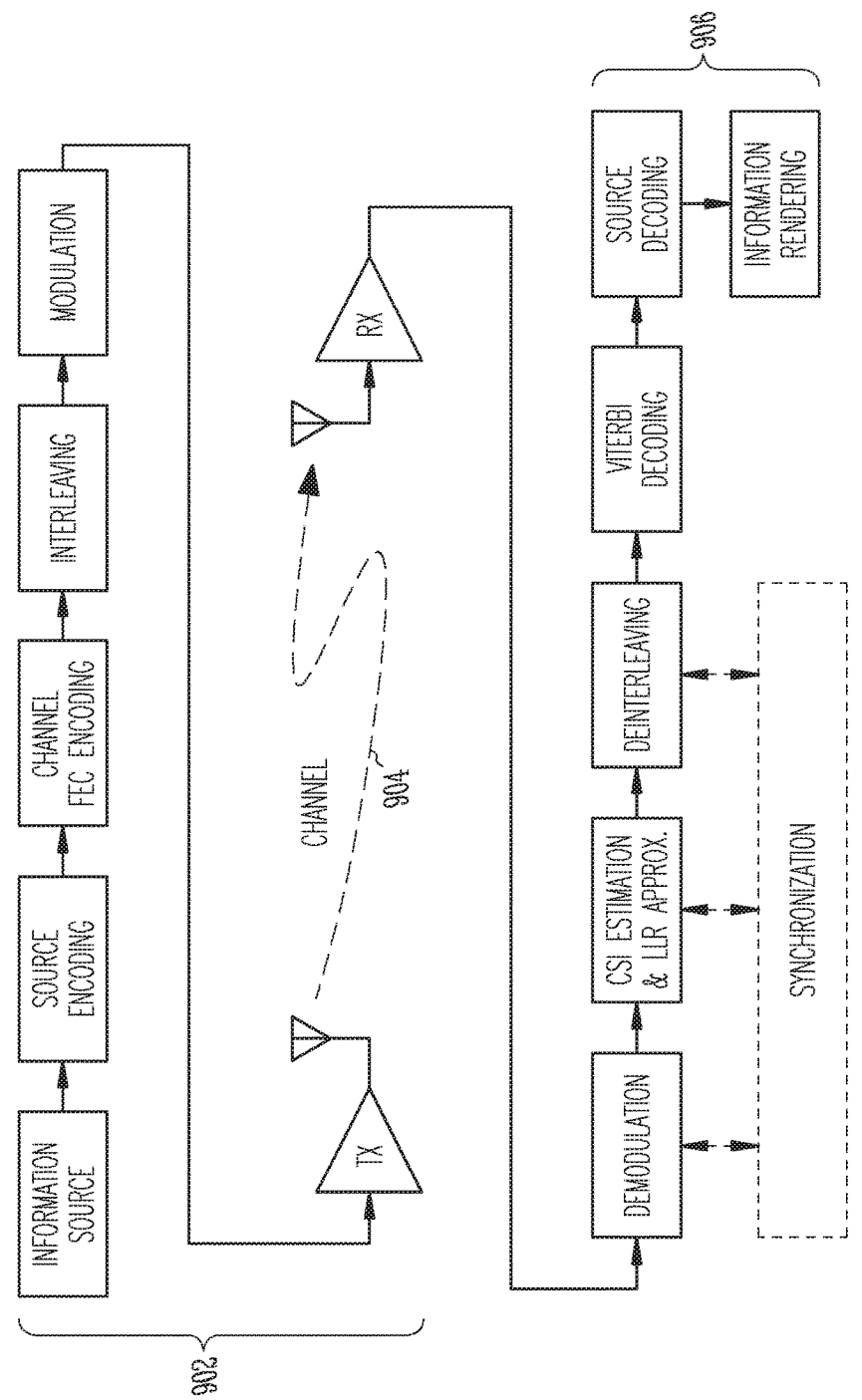
FIG. 9 is a high-level functional block diagram on IBOC radio broadcast system.

FIG. 9 is a high-level functional block diagram of an IBOC radio broadcast system. The block diagram shows the transmitter side and the receiver side of the system. At the transmitter 902, after redundancy is removed from the source information to satisfy system bandwidth requirements, the IBOC digital radio signal is encoded to improve signal coverage and robustness using a convolutional Forward Error Correction (FEC) code. The encoded data symbols are then interleaved and modulated for transmission over the radio channel 904.

The receiver 906 performs the inverse of the transmitter 902. The functions of the receiver 906 shown in FIG. 9 can be performed using the digital signal processor 128 of FIG. 8. In FIG. 9, a demodulated stream of coded symbols is "weighted" by the CSI Estimation and LLR Approximation components prior to deinterleaving, presentation to a Viterbi decoder, and source decoding. The description mainly focuses on the CSI Estimation and LLR Approximation calculations of the receiver 906. The improved CSI estimation and LLR approximation calculations described can improve the capacity and robustness of the sidebands of the IBOC radio signal.

BPSK and OPSK CSI Estimation and Soft Metrics (LLRs)

Viterbi Decoder Symbol Metric

CSI symbol weighting is an important aspect of soft-decision Viterbi decoding, where the value (weight) of the symbol depends on its reliability, or the SNR. For ideal Viterbi decoding, weighting of the convolutionally encoded symbols yields the Log-Likelihood Ratio (LLR) metric for each received symbol. It is desirable to generate these symbol weights for the IBOC radio signal using quadrature phase shift keying (QPSK) symbol demodulation and quadrature amplitude modulation (QAM) symbol demodulation. However, particular techniques for estimating the LLRs can be complex, and can depend on the signal structure for receiving digital signals with deinterleaving in multipath fading and non-uniform interference. A description of determining the LLR for binary antipodal symbols is presented first, and generalizations to QPSK and QAM follow.

The LLR for binary antipodal code symbols or bits (i.e., Binary Phase Shift Keying, or BPSK) corrupted by Gaussian noise is related to the SNR of the received symbol. This SNR is the ratio of the signal energy to the noise energy (variance estimate) for the symbol (i.e., from the output sample of a receiver matched filter). For example, in a received a sequence of BPSK symbols of energy Es, with voltage or amplitude $\alpha=\sqrt{Es}$ proportional to the channel gain, the $k^{th}$ received symbol is represented as $s_k=\alpha_k \cdot (2 \cdot d_k-1)$ with the equiprobable binary information conveyed by $d_k=0$ or 1.

The receiver filter is presumed to be optimally matched to the symbol waveform impulse response, yielding a matched filter output $y_k=s_k+n_k$, where $n_k$ is a noise sample. The LLR ($\lambda$) for a received binary symbol $y_k$ is, from Bayes' Rule, the log of the ratio of the two possible likelihoods (or probability density functions):

$$\lambda_k = \ln\frac{Pr(d=1 \mid y_k)}{Pr(d=0 \mid y_k)} = \ln\frac{Pr(y_k \mid d=1) \cdot Pr(d=1)}{Pr(y_k \mid d=0) \cdot Pr(d=0)}$$

$$\text{since } Pr(d=1) = Pr(d=0), \text{ then } \lambda_k = \ln\frac{f_n(y_k - s_{d=1})}{f_n(y_k - s_{d=0})},$$

where $s_{d=1}$ stands for the symbol constellation value for d=1, and $s_{d=0}$ stands for the symbol constellation value for d=0. The probability density function of the (typically assumed) additive white Gaussian noise (AWGN) sample n with zero mean and variance $\sigma^2$ is $$f_n(x) = \frac{1}{\sqrt{2\pi\sigma^2}} \cdot \exp\left[-\frac{x^2}{2\sigma^2}\right].$$

The LLR $\lambda_k$ for this BPSK symbol example becomes $$\lambda_k = \ln\frac{\exp\left[-\frac{1}{2\sigma_k^2} \cdot (y_k - s_{d=1})^2\right]}{\exp\left[-\frac{1}{2\sigma_k^2} \cdot (y_k - s_{d=0})^2\right]}$$

$$= \frac{1}{\sigma_k^2}[y_k \cdot (s_{d=1} - s_{d=0}) - 0.5 \cdot (s_{d=1}^2 - s_{d=0}^2)].$$

The nominal received BPSK constellation points are symmetric at ±α, corresponding to binary values $d_k=1$ or 0, respectively. This antipodal symmetry simplifies the LLR to $$\lambda_k = y_k \cdot \frac{2 \cdot \alpha_k}{\sigma_k^2}.$$

Use of the natural logarithm is convenient for several reasons. It avoids computation of Gaussian exponentials in the LLR since the log of an exponential yields the exponent. The logarithm also allows the Viterbi decoder to sum the log of the likelihood ratios of the coded message symbol sequence, instead of multiplying the likelihood ratios (without log). Furthermore, the logarithm reduces the dynamic range (number of bits) required of signal processing. The ideal LLR $\lambda_k$ for this BPSK case can be expressed as the product of the received symbol sample $y_k$ and a CSI weight $w_k$, or $$\lambda_k = y_k \cdot w_k$$

$$\text{where } w_k = \frac{2 \cdot \alpha_k}{\sigma_k^2}$$

Notice that the LLR is in units of symbol energy divided by noise energy which takes the form $$\lambda_k = \left(\sqrt{Es} \cdot (2 \cdot d_k - 1) + n_k\right) \cdot \frac{2 \cdot \sqrt{Es}}{\sigma_k^2} = \pm \frac{2 \cdot Es}{\sigma_k^2} + n'_k$$

where the binary (0, 1) values of $d_k$ are converted to ±1 using $(2 \cdot d_k - 1)$.

After scaling, quantizing, and deinterleaving, these LLRs can be presented to the Viterbi decoder to compute the Maximum Likelihood Sequence Estimate (MLSE) of the transmitted message. The scaling of the LLRs could be arbitrary, since the Viterbi decoder simply finds the path with minimum Euclidian distance from the received sequence among all the possible valid message sequences through the trellis. In practice, however, the LLRs are usually scaled and quantized with reduced precision (e.g., reduced number of bits) to conserve implementation resources. Therefore, scaling relative to the noise standard deviation becomes important to maximize performance.

Because the characteristics (or statistics) of the channel, noise, and interference are generally not precisely known, and the computation can be burdensome, a robust approximation of the LLR is often used in practice, assuming a Gaussian-like noise distribution. First, the complex channel gain and noise variance are estimated and used to compute a CSI weight for each symbol. The approximation also employs a clipping-like nonlinearity to mitigate the effects of impulsive-like noise. Each received code symbol is then multiplied by its estimated CSI weight to approximate the LLR for that symbol.

The receiver estimates the appropriate CSI weighting with values that are unique for each received symbol because the SNR and signal phase for each symbol can vary over time and frequency. This variation is a function of the interleaver (time and frequency distribution of the encoded bits), multipath fading, and potentially non-uniform interference over the channel. Reference subcarriers aid in estimating the complex channel gain and noise variance, and the resulting CSI is interpolated over the remaining data-bearing subcarriers.

CSI Estimation for OFDM QPSK Symbols

Figure 10:
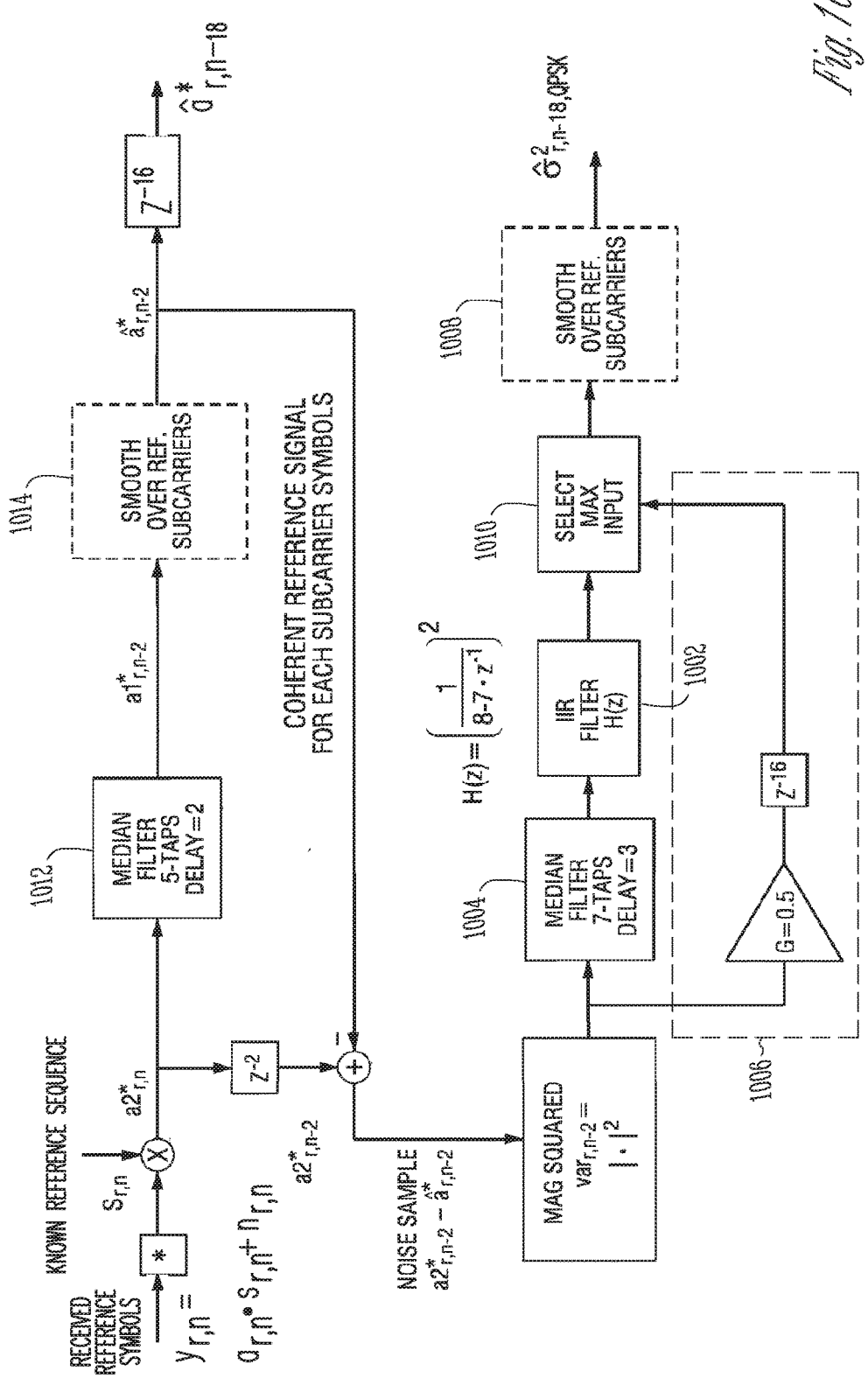
FIG. 10 is a functional block diagram of an example of a CSI estimation process.

FIG. 10 is a functional block diagram of an example of a CSI estimation process. The CSI estimation process may be performed using processing circuitry of a radio receiver, such as the digital signal processor of the example receiver of FIG. 8. The CSI estimate is used to form the appropriate CSI weight $w_k$ for each received reference symbol $y_{r,n}$, where r is the reference subcarrier index and n is the OFDM symbol index. The process provides estimates of the coherent channel complex (conjugate) gain ($\hat{a}^*$) along with estimates of the noise variance ($\sigma^2$) or interference. These estimates are local in time and frequency (subcarrier location) to accommodate the dynamic selective fading channel experience in a mobile environment, such as a moving automobile for example.

Each received QPSK symbol can be represented by $$y_{sc,n} = a_{sc,n} \cdot \frac{(2 \cdot d_{sc,n,I} - 1) + j \cdot (2 \cdot d_{sc,n,Q} - 1)}{\sqrt{2}} + n_{sc,n}$$

where sc represents the OFDM data subcarrier index, n is the OFDM symbol index, $a_{sc,n}$, is proportional to complex channel gain, and $d_{sc,n,I}$ and $d_{sc,n,Q}$ are the binary code bits imposed on the Inphase (I) and Quadrature (Q) components of the QPSK symbol. The 4-phase-modulated data term following $a_{sc,n}$ is normalized (divided by $\sqrt{2}$) to unity magnitude. The noise sample associated with this symbol is $n_{sc,n}$.

The complex conjugate of the channel gain $\hat{a}_{r,n}^*$ is estimated for each Reference Subcarrier r and OFDM symbol n. These Reference Subcarriers are located every 19$^{th}$ subcarrier spanning each sideband. They are spaced in frequency by approximately 6904 Hz to accommodate the effects of frequency-selective fading. After stripping off the modulated Reference Subcarrier data (repeating 32-bit sequence) decoded during frame synchronization, the resulting reference symbols are filtered to yield $\hat{a}_{r,n}$, representing the (possibly noisy) complex channel gain, which can vary dynamically with fading or movement of the receiver antenna, for example. The QPSK symbol noise variance $\hat{\sigma}_{r,n,QPSK}^2$ is also estimated. The estimated values for $\hat{a}_{r,n}^*$ and $\hat{\sigma}_{r,n,QPSK}^2$ are later interpolated over the data-bearing subcarriers $y_{sc,n}$ with data subcarrier index sc. The subcarrier symbol indices r,n or sc,n will be replaced with simpler index k in subsequent text for convenience without loss of generality.

FIG. 10 shows that CSI parameter $\hat{a}_k^*$ is estimated for each QPSK symbol after stripping off the known data imposed upon the Reference Subcarriers. A complex median filter is used to reduce the noise from the symbol samples, while also mitigating sensitivity to impulse noise and step transients. This complex median filter separately computes the medians of the pair of complex components.

The variance $\hat{\sigma}_{k,QPSK}^2$ of the noise of the QPSK symbol is also estimated. Notice that the additional QPSK subscript is used to differentiate this from the variance used in the previous expressions for the LLR of the antipodal BPSK signal. Since the QPSK symbol is composed of a pair of orthogonal BPSK symbols, then the variance of the complex QPSK symbol is twice that of the BPSK symbol previously analyzed ($\hat{\sigma}_{k,QPSK}^2 = 2 \cdot \hat{\sigma}_k^2$). Similarly, the QPSK complex symbol gain $\hat{a}_k$ (not energy) has a greater magnitude than the BPSK scalar value $\hat{\alpha}_k$, so $\hat{a}_k = \sqrt{2} \cdot \hat{\alpha}_k$.

The complex LLR for QPSK symbols can be expressed as equivalent to an orthogonal pair (I and Q) of BPSK LLRs. The I and Q LLR components are separated after multiplying the received QPSK symbol by the complex conjugate of the symbol gain, equalizing the phase.

Choice of an appropriate QPSK CSI weight $w_{k,QPSK}$ for multiplication with the received QPSK symbol $y_{k,QPSK}$ will yield the pair of LLRs. $\lambda_{k,I}$ and $\lambda_{k,Q}$, for the code bit air:

$$y_{k,QPSK} \cdot w_{k,QPSK} = y_{k,I} \cdot \frac{2 \cdot \alpha_k}{\sigma_k^2} + j \cdot y_{k,Q} \cdot \frac{2 \cdot \alpha_k}{\sigma_k^2} = \lambda_{k,I} + j \cdot \lambda_{k,Q}$$

$$\text{where } w_{k,QPSK} = \frac{4 \cdot a_k^*}{\sigma_{k,QPSK}^2}.$$

The I and Q components of the QPSK LLRs, $\lambda_{k,I}$ and $\lambda_{k,Q}$, represent the bit metrics that are subsequently scaled, quantized, deinterleaved, and decoded using a Viterbi decoder. The values of each of the bit metrics are proportional to the signal-to-noise energy ratios, having the polarity of the binary code bit.

It should be noted that $w_{k,QPSK}$ includes a factor of four in the weight calculation. This is for consistency with conventional LLR scaling. Ideally, the factor-of-4 scaling has no effect on Viterbi decoding performance, because the Viterbi algorithm simply picks the best path among all possible valid messages; in such cases, an arbitrary scale factor has no influence on finding the best path. However, nonlinearities such as quantization, limiting, and bias correction (if any) can be affected by the scaling. These nonlinearities are appropriately accommodated in the analyses provided below.

Bias Errors in CSI Estimation

Conventional CSI estimates of the QPSK complex conjugate signal gain $\hat{a}_k^*$ and noise variance $\hat{\sigma}_{k,QPSK}^2$ can be used here in computing binary LLR bit metrics for all QPSK and future QAM modes, but there are bias errors associated with these conventional estimates. It is desirable to correct the estimates for these bias errors prior to their use in the LLR computations. There are several sources contributing to these bias errors. They include an additive bias error for $\hat{a}_k^*$, and two multiplicative bias factors: a bias included in the noise variance estimation and a bias in the excess noise feedforward path in the process of FIG. 10.

Noise Variance Estimation Bias

The noise variance estimation process in FIG. 10 uses a median filter to improve performance with switching transients, impulsive-like noise, and to accommodate a faster automatic gain control (agc) function common in the front-end or IF section of receivers. The infinite impulse response (IIR) filter 1002 is preceded by a 7-tap median filter 1004 and includes an excess-noise feedforward path 1006. Furthermore, it measures the variance about the median of the samples, not the mean. It is useful to relate the actual variance to the estimation variance of the process of FIG. 10.

The 7-tap median filter 1004 is used to preprocess the noise-squared samples prior to linear IIR filtering and filtering over frequency (smoothing over Reference Subcarriers 1008). In this case, the median filter produces a biased estimate of the variance due to the asymmetric probability density function (pdf) property of the noise-squared samples. This bias can be adjusted for subsequent operation in the noise estimation process. Specifically, each input sample x to the median filter is assumed to consist of the sum of a pair (complex) of the squares of zero-mean Gaussian noise samples, where $x=u^2+v^2$. This is a Chi-Square distribution with 2 degrees of freedom. The Gaussian pdfs of noise samples u and v are $$p(u) = p(v) = \frac{\exp\{-v^2/2\sigma^2\}}{\sigma\sqrt{2\pi}}; \; p(u,v) = \frac{\exp\{-(u^2+v^2)/2\sigma^2\}}{2\pi\sigma^2}.$$

The cumulative distribution function of the Chi-Square distribution x can be found with a change of variables and integrating as follows:

$$P(x) = \int\int_{u^2+v^2 \leq x} p(u,v) \cdot du \cdot dv = 1 - \exp\{-x/2\sigma^2\}.$$

Then the probability distribution function (pdf) of x, p(x), is found from differentiation of P(x).

$$p(x) = \frac{\exp\{-x/2\sigma^2\}}{2\sigma^2}; \text{ for } x \geq 0.$$

The noise variance is defined as the mean of x $$\sigma_x^2 = \frac{1}{2\sigma^2}\int_0^\infty x \cdot \exp\{-x/2\sigma^2\} dx = 2\sigma^2.$$

The median of x can be found by solving for medx in the following equation:

$$\frac{1}{2\sigma^2}\int_0^{medx} \exp\{-x/2\sigma^2\} dx = \frac{1}{2\sigma^2}\int_{medx}^\infty \exp\{-x/2\sigma^2\} dx$$

$$\exp\{-x/2\sigma^2\}|_0^{medx} = \exp\{-x/2\sigma^2\}|_{medx}^\infty$$

$$\exp\{-medx/2\sigma^2\} - 1 = -\exp\{-medx/2\sigma^2\}$$

$$\exp\{-medx/2\sigma^2\} = 1/2$$

$$medx = 2\sigma^2 \cdot \ln(2).$$

A linear FIR filter estimates the mean of the input signal. However, the estimation bias factor of the median, because of the asymmetric pdf, is found as the ratio of the median to the mean, or $$\text{med\_bias} = \frac{medx}{\sigma_x^2} = \frac{2\sigma^2 \cdot \ln(2)}{2\sigma^2} = \ln(2) \cong 0.693.$$

Therefore, the median underestimates the Gaussian noise variance by a factor of the natural logarithm of 2, or ln(2). This estimation bias factor of the median should be accounted for when used to replace the mean estimate in the noise variance estimation process.

Scaling of the noise estimate due to the median bias factor would not generally be an issue if all the noise estimates for all the symbols presented to the Viterbi decoder were scaled by the same factor. However, the excess-noise feedforward path estimate is just one example where the scaling does matter. Furthermore, nonlinearities in forming the LLRs (e.g., fixed-point quantization and overflow) may also have an effect.

Excess Noise Feedforward Path Bias

In a purely AWGN channel, an optimum receiver would not select the excess-noise feedforward path, and the optimum noise filter would be linear (e.g., ITR or FIR) and span a long time period. The excess-noise feedforward path is provided only to handle impulsive-like noise, or coherent reference errors due to switching transients, etc. In these cases, the excess-noise feedforward path mitigates the occasional effects of large noise bursts without contaminating the longer term variance estimates provided by the IIR filter. The excess-noise feedforward path is scaled by G, and a fraction of the noise input samples would exceed the median of the median-filtered path, and these would be selected by the "SELECT MAX INPUT" function 1010 in the noise estimate path. If the scaling is small, then the excess-noise feedforward path would be selected less frequently and minimize losses in the AWGN case.

The probability that the excess-noise feedforward path is selected is approximately equal to the probability that the input noise-squared samples x times gain G exceeds the median. Notice that the median is replaced by mean·ln(2) in accordance with the median bias correction result presented previously:

$$prob\{\text{excess path selected}\} =$$
$$prob\{x \cdot G > \text{median}\} = prob\left\{x > \frac{\text{mean} \cdot \ln(2)}{G}\right\} =$$
$$prob\left\{x > \frac{2 \cdot \sigma^2 \cdot \ln(2)}{G}\right\} = \frac{1}{2\sigma^2} \int_{2 \cdot \ln(2)\sigma^2/G}^{\infty} \exp\{-x/2\sigma^2\} \cdot dx = 2^{-1/G}.$$

Therefore, the probability that the excess-noise feedforward path is selected is approximately $2^{-1/G}$.

The increase factor in noise estimation variance due to selecting the excess-noise feedforward path can be computed as the ratio of the noise contributed by the median path plus the excess noise contribution, to the median. This excess_bias ratio can be computed as a function of G, or $$\text{excess\_bias}(G) = \frac{\text{median}(x) \cdot [1 - prob\{\text{excess path selected}\}] + \frac{G}{2 \cdot \sigma^2} \cdot \int_{2 \cdot \ln(2) \cdot \sigma^2/G}^{\infty} x \cdot \exp\left\{\frac{-x}{2 \cdot \sigma^2}\right\} \cdot dx}{\text{median}(x)}$$

Solving Some Terms $$\frac{G}{2 \cdot \sigma^2} \cdot \int_{2 \cdot \ln(2) \cdot \sigma^2/G}^{\infty} x \cdot \exp\left\{\frac{-x}{2 \cdot \sigma^2}\right\} \cdot dx = 2 \cdot \sigma^2 \cdot 2^{-1/G} \cdot [G + \ln(2)],$$

and $\text{median}(x) = \text{mean}(x) \cdot \ln(2) = 2 \cdot \ln(2) \cdot \sigma^2,$ then substituting yields $$\text{excess\_bias}(G) = [1 - 2^{-1/G}] + \frac{2 \cdot \sigma^2 \cdot 2^{-1/G} \cdot [G + \ln(2)]}{2 \cdot \sigma^2 \cdot \ln(2)},$$

simplifying to $$\text{exess\_bias}(G) = 1 + \frac{G \cdot 2^{-1/G}}{\ln(2)}.$$

Figure 11:
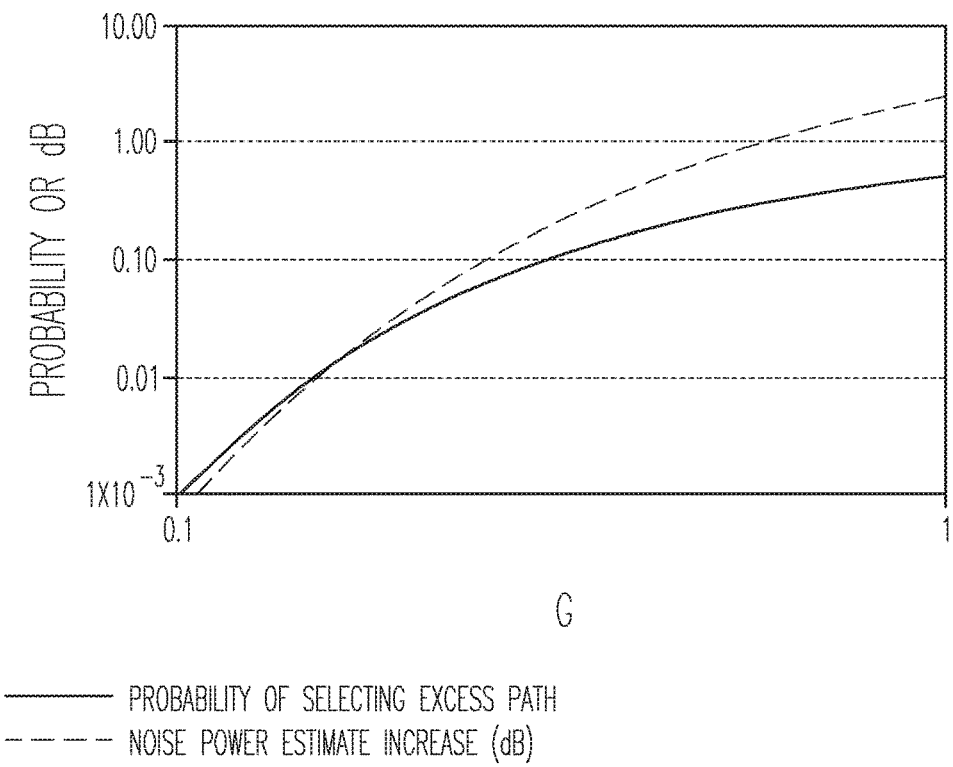
FIG. 11 is a plot showing the probability of selecting the excess-noise feedforward path and the increase in noise variance estimate versus the feedforward excess noise gain.

FIG. 11 is a plot showing the probability of selecting the excess-noise feedforward path and the increase in noise variance estimate versus the feedforward excess noise gain G. A value of G=0.5 was empirically determined to be a reasonable compromise for the excess-noise gain. This value yields minimal losses in the AWGN case, but is also effective in minimizing losses due to switching transients. Furthermore, the performance with one or both of a fast agc and first adjacent FM interference is improved.

The noise variance increase for G=0.5 is approximately excess_bias(G)=1.18; or 0.72 dB. So the variance bias can be corrected with a factor of ln(2) for the median filter, and excess_bias(G) for the excess-noise path. So the biased noise-variance estimate is $$\hat{\sigma}^2 = \sigma^2 \cdot \text{med\_bias} \cdot \text{excess\_bias}(G) = \ln(2) + G \cdot 2^{-1/G}.$$

Solving for the Bias-Corrected Noise Variance Yields $$\hat{\sigma}^2_{corrected} = \frac{\hat{\sigma}^2}{\ln(2) + G \cdot 2^{-1/G}}. \quad (1)$$

IIR Filter for Estimation Noise Reduction

The IIR filter in the noise-variance estimation process is used to reduce the estimation noise of the median filter at the IIR input. However, the median value or scaling is not affected. Therefore, this IIR filtering is not used to compute the variance reduction factor $r_a$. Each output sample $y_n$ of the 2-pole IIR lossy integrator filter is a function of the new input sample $x_n$ and the 2 previous outputs, e.g., $$y_n = \beta^2 \cdot x_n + 2 \cdot (1-\beta) \cdot y_{n-1} - (1-\beta)^2 \cdot y_{n-2}.$$

The IIR filter expression has a dc gain of one, and its impulse response (time) depends upon the parameter β.

The delay of this filter is determined to properly delay the excess noise path. The peak of the impulse response (mode) occurs in half the time of group delay, where the group delay is more indicative of the step response time. The mean and mode delays can be computed as a function of parameter β. The effective delay of the filter should be at least the mode delay, but not more than the group delay, where $$\text{group\_delay} = \text{mean\_delay} = 2 \cdot \left(\frac{1}{\beta} - 1\right)$$

$$\text{mode\_delay} = \frac{1}{\beta} - 1.$$

This effective delay should be appropriately compensated when applying the noise estimates in forming the LLRs. For a value of β=⅛, group_delay=14 and mode_delay=7. In the analysis, a value of 13 is used for the effective delay.

The Gaussian noise suppression ability can be assessed in a manner similar to the finite impulse response (FIR) filter where the variance reduction of the noise estimate from input to output is equal to the sum of the squares of the normalized filter coefficients (dc gain=1). Note that this variance reduction is associated with the error variance of the estimate of the noise variance, and not the reduction of the variance of the noise power. For the IIR filter, having virtually an infinite number of equivalent FIR coefficients, this computation is more conveniently performed on the z-transform of the filter impulse response, taking the limit for large N approaching a continuous spectrum, then applying Parseval's theorem. Substituting $z=e^{j \cdot 2 \cdot \pi \cdot n/N}$ into the z-transform of the IIR filter yields $$H(n, \beta) = \frac{\beta^2}{1 - 2 \cdot (1 - \beta) \cdot e^{-j \cdot 2 \cdot \pi \cdot n/N} + (1 - \beta)^2 \cdot e^{-j \cdot 4 \cdot \pi \cdot n/N}},$$

and its magnitude is $$|H(n, \beta)| = \frac{\beta^2}{2 - 2 \cdot \beta + \beta^2 - 2 \cdot (1 - \beta) \cdot \cos(2\pi \cdot n/N)}.$$

The estimation variance reduction factor $r_{IIR}$ from input to output samples can be computed using Parseval's theorem as $$r_{IIR} = \lim_{N \to \infty} \left\{ \frac{1}{N} \cdot \sum_{n=0}^{N-1} |H(n, \beta)|^2 \right\}.$$

In the limit, the summation can be integrated as $$r_{IIR} = \frac{1}{2 \cdot \pi} \cdot \int_0^{2\pi} \left[ \frac{\beta^2}{2 - 2 \cdot \beta + \beta^2 - 2 \cdot (1 - \beta) \cdot \cos(\phi)} \right]^2 d\phi.$$

Then $r_{IIR}$ can be found as a function of the IIR filter parameter β after integration.

$$r_{IIR} = \frac{\beta \cdot (2 \cdot \beta - 2 - \beta^2)}{(\beta - 2)^3}.$$

The variance reduction $r_{IIR}$ for AWGN achieved by the IIR filter with β=⅛ is approximately $r_{IIR}$=−14.75 decibels (dB).

The filtering across frequency provides another 7 dB in noise reduction for AWGN as shown previously using the same filter design for â*. The resulting noise estimation error of only the IIR and frequency filters is then roughly 22 dB better than the variance of a single noise sample input to the filter. This results in a noise variance estimation error having a standard deviation of about 8% of the filter input noise variance, or equivalently averaging over approximately 150 noise samples. This filtering reduces the noise of the median filter estimate, but not the bias itself Channel Gain Estimation Error The complex channel gain-squared estimate $|â_{biased}|^2$ includes an unintentional noise bias component in addition to the signal-squared component (if any). For example, the mean value of the channel gain should be zero when there is no signal present. However the mean value of the noise over the finite filter span used for estimation is generally nonzero. This means the resulting uncorrected LLR is not generally zero when there is no signal. This inaccuracy can be compensated by a bias-correction function. The biased estimate of the magnitude-squared channel gain is increased by the variance of the residual noise of the Reference Subcarrier symbols after filtering. This noise bias is reduced by the variance reduction factor $r_a$ due to the median filter and filtering over the Reference Subcarriers in the final estimate of $|â|^2$. The expected value of the biased magnitude-squared channel gain is $$|â|^2 = |a|^2 + r_a \cdot \sigma^2.$$

The bias term $r_a \cdot \sigma^2$ can be simply corrected (removed) by solving for the bias-corrected $|â|^2$, or $$|â|^2_{corrected} = |â|^2 - r_a \cdot \sigma^2.$$

The expression above for the bias-corrected magnitude-squared channel gain is a function of its biased estimate, the variance reduction factor $r_a$, and the actual unbiased noise variance $\sigma^2$.

The combination of the 5-tap median filter 1012 and the FIR filter used to smooth across the Reference Subcarriers at 1014 results in the variance reduction factor $r_a$. The ratio of the noise variance of the filter output samples to the noise variance of the input samples of the 5-tap complex median filter is approximately 0.286 (−5.44 dB). This assumes a constant gain parameter a over the filter span, and corruption by AWGN. The filter used to smooth the estimates across the Reference Subcarriers has 9 taps which are normalized such that their sum is unity, yielding a dc gain of one.

$$coef = \frac{1}{256} \cdot (1 \quad 8 \quad 28 \quad 56 \quad 70 \quad 56 \quad 28 \quad 8 \quad 1)^T.$$

The variance reduction for this FIR filter is equal to the sum of the squares of the normalized filter coefficients, $$\sum_n coef_n^2.$$

The variance reduction for this filter is approximately 0.196 or about −7.07 dB. The composite variation reduction for the 5-tap complex median filter and the 9-tap FIR filter is approximately $r_a$=0.056 (−12.5 dB). However, the estimate of the noise variance is also biased and should be corrected as described previously. An expression for the bias-corrected channel gain squared is $$|â|^2_{corrected} = \max\{0, |â|^2 - r_a \cdot \hat{\sigma}^2_{corrected}\}, \qquad (2)$$

where the max function is used to prevent negative values for the magnitude-squared gain.

QAM LLRs

Figure 12:
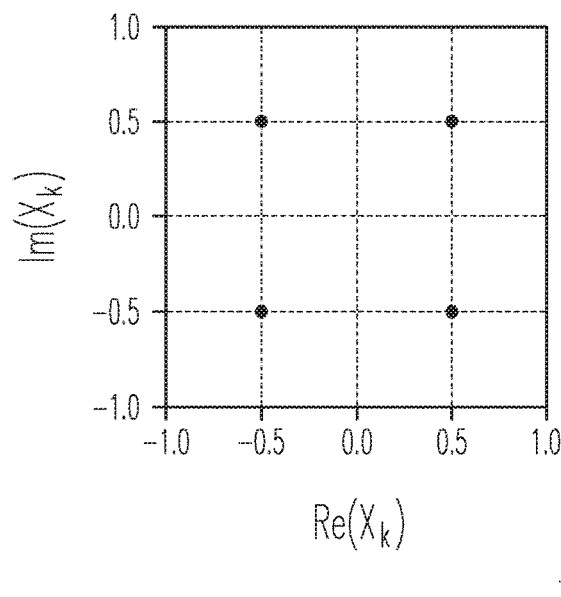
FIG. 12 is a plot showing constellation points on the unit grid spacing for quadrature phase shift keying (QPSK) or a four-point quadrature amplitude modulation (4-QAM) constellation.

It is desirable to develop a common parameterized algorithm for processing both QPSK and QAM symbols. QPSK modulation can be viewed as a special QAM case (i.e., 4-QAM), where the two-bit QPSK symbol is modulated with one bit per dimension (BPSK) on the Inphase (I) and Quadrature (Q) axes. FIG. 12 shows an example of a symbol constellation grid for QPSK or 4-QAM symbols. The label QPSK can be used interchangeably with QAM (e.g., 4-QAM) in the description of the processing of the QAM symbols. The QPSK symbol processing can include normalization, equalization, scaling, limiting, and weighting of the received symbols by the receiver demodulator.

QPSK Normalization, Equalization, Scaling, Limiting, and Weighting

The modified CSI estimation operations differ from the method described previously herein, in which the received QPSK symbol $y_{k,QPSK}$ was multiplied by a complex QPSK CSI weight $w_{k,QPSK}$ to yield a pair of LLRs, $\lambda_{k,I}$ and $\lambda_{k,Q}$. In the modified method of determining LLRs for 4-QAM or QPSK symbols, the symbols are normalized to unity mean energy. Scaling and equalization then places the QAM constellation samples on a unit grid spacing. Potential noise peaks are then limited, and CSI weighting is applied.

A received QPSK symbol $y_{k,QPSK}$ is equalized and normalized to unit energy by dividing the symbol by the complex channel gain a. The normalized received symbol is also multiplied by the scale factor g. e.g. $g_{QPSK}=\sqrt{1/2}$, to conform the symbol to the QPSK unit-spaced constellation grid (i.e., ±0.5 in each I or Q dimension). This resulting constellation sample can be expressed as $$x_k = y_{k,QPSK} \cdot \frac{g_{QPSK}}{a} = y_{k,QPSK} \cdot \frac{g_{QPSK} \cdot a^*}{|a|^2}.$$

A plot showing the four possible QPSK or 4-QAM constellation points $x_k$, given the two bits $d_I$ and $d_Q$ of symbol information, is shown in FIG. 12.

The effect of additive white Gaussian noise (AWGN) on symbols can be viewed as enlarging the locus of received constellation samples, causing a "fuzz ball" rather than a discrete constellation point. Errors occur when the constellation samples spread across decision boundaries and the actual transmitted symbols cannot be discerned by the radio receiver. Soft metrics can be used to quantify the reliability of the points on the constellation grid prior to passing them to the Viterbi Encoder. However, the accuracy of a soft metric can degrade in the presence of impulse noise.

Figure 13A:
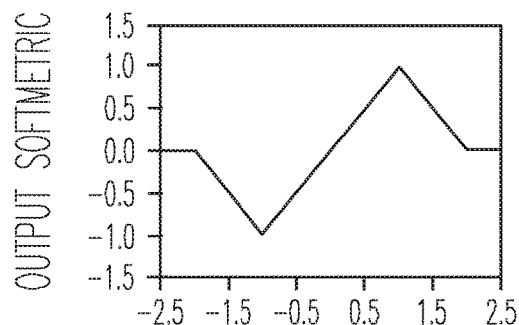
FIGS. 13A and 13B are plots of Soft 4-QAM Metric nonlinearities.

Limiting the symbol samples can improve performance in the presence of impulsive nose. A soft metric should perform nearly the same in AWGN as previously considered metrics, yet it should have smaller degradation (relative to the Gaussian-based metric) in impulsive noise. An improvement to constructing a soft metric is to pass the noisy symbol constellation sample $x_k$ through a nonlinearity, or modify the constellation sample using a nonlinearity function. This nonlinearity is imposed on each of the complex constellation samples corresponding to the pair of symbol bits. The nonlinearity maintains the linear relationship of $x_k$, but limits the larger values of the metric to effectively limit the effects of noise peaks. This improves robustness in the presence of impulsive nose and can be accomplished with either of the nonlinear Soft QPSK Metrics presented in FIGS. 13A and 13B. Each complex constellation sample $x_k$ comprises a pair of constellation component outputs, corresponding to the Inphase (I) and Quadrature (Q) components of the symbol. Both of these output soft metrics are labeled bitA(x) on the vertical axis in anticipation of (B) and (C) bits for higher-order QAM soft metrics described below.

To this point normalization, equalization, scaling and limiting in the modified method of determining LLRs have been discussed. In weighting, the soft metrics are compensated with a multiplicative factor known as the QPSK CSI weight, or $w_{QPSK,modified}$. The QPSK CSI weight can be expressed as the product of the previous QPSK CSI weight $w_{QPSK}$ and the complex channel gain a divided by the QAM scale factor $g_{QPSK}$, or $$w_{QPSK,modified} = w_{QPSK} \cdot \frac{a}{g_{QPSK}}.$$

Incorporating the bias-corrected CSI estimates yields an expression for the bias-corrected CSI weight for the proposed modified QPSK metric.

$$w_{QPSK,modified} = w_{QPSK} \cdot \frac{a}{g_{QPSK}} = \frac{4 \cdot |\hat{a}|^2_{corrected}}{\hat{\sigma}^2_{corrected} \cdot g_{QPSK}};$$

or after substitution for parameters, $$w_{QPSK,modified} = \frac{4}{g_{QPSK}} \cdot \max\left\{0, \frac{|\hat{a}|^2}{\hat{\sigma}^2} \cdot [\ln(2) + G \cdot 2^{-1/G}] - r_a\right\}$$

It should be noted that the modified CSI weight $w_{QPSK,modified}$ is now a multiplier for each component (I or Q) of constellation sample $x_k$, whereas the unmodified weight $w_{QPSK}$ was multiplied by complex received symbol $y_k$, prior to normalization, phase-equalization and scaling. The LLR is computed by passing $x_k$ through the Soft QAM Metric nonlinearity of either of FIG. 13A or 13B and multiplying the result by the CSI weight, or $$\lambda_{QPSK,modified} = \text{bitA}(x_k) \cdot w_{QPSK,modified}.$$

QAM Normalization, Scaling, and Weighting

A 16-QAM symbol is created by modulating its I or Q components as a pair of independent orthogonal 4 amplitude shift keying or 4-ASK signals. The 4-ASK symbols are generated from specially selected two-bit groups (A or most significant bit (MSB), and B or least significant bit (LSB)), which are used to address Gray-mapped constellation points. The mapping of the code-bit pairs to the four levels of the 4-ASK symbols is presented in Table 1.

TABLE 1

Mapping of I or Q Code Bits to Four Levels of the 4-ASK Symbols

| MAPPING | Level −1.5 | Level −0.5 | Level +0.5 | Level +1.5 |
|---|---|---|---|---|
| A (MSB) | 0 | 0 | 1 | 1 |
| B (LSB) | 0 | 1 | 1 | 0 |

Likewise, the 64-QAM symbol is created by modulating its I or Q components as a pair of independent orthogonal 8-ASK signals. The 8-ASK symbols are generated from specially-selected three-bit groups (A or MSB, B or XSB, and C or LSB), which are used to address Gray-mapped constellation points. The mapping of the code-bit triplets to the eight levels of the 8-ASK symbols is presented in Table 2.

TABLE 2

Mapping of I or Q Code Bits to Eight Levels of the 8-ASK Symbols

| MAPPING | Level −3.5 | Level −2.5 | Level −1.5 | Level −0.5 | Level 0.5 | Level 1.5 | Level 2.5 | Level 3.5 |
|---|---|---|---|---|---|---|---|---|
| A (MSB) | 0 | 0 | 0 | 0 | 1 | 1 | 1 | 1 |
| B (XSB) | 0 | 0 | 1 | 1 | 1 | 1 | 0 | 0 |
| C (LSB) | 0 | 1 | 1 | 0 | 0 | 1 | 1 | 0 |

The general QAM LLR differs from the binary antipodal case presented above, because there are multiple decision regions along the x axis where the bit changes polarity due to ASK mapping. An approximation for the LLRs can be used in the QAM case to avoid evaluation of exponentials. Assuming N code bits per ASK symbol in each dimension (I or Q), instead of the single bit in each dimension of the QPSK case, the binary metric for the n-th bit is given by $$\lambda_{k,n} = \ln\frac{Pr(d_n = 1 \mid x_k)}{Pr(d_n = 0 \mid x_k)} = \ln\frac{\sum_{alls_j^{1,n}} f_{noise}(x_k - s_j^{1,n})}{\sum_{alls_j^{0,n}} f_{noise}(x_k - s_j^{0,n})};$$

$$n = 1 \ldots N;\ j = 1 \ldots 2^N.$$

This expression can be simplified by using only the maximum exponential term in the denominator and numerator, which is dominated by the nearest decision boundary where the polarity changes occur. This is a reasonable approximation since the maximum exponentials are generally much larger than the others in the expression.

$$\lambda_{k,n} \cong \ln\frac{\max_{alls_j^{1,n}} \exp\left[-\frac{1}{2\sigma_k^2}(x_k - s_j^{1,n})^2\right]}{\max_{alls_j^{0,n}} \exp\left[-\frac{1}{2\sigma_k^2}(x_k - s_j^{0,n})^2\right]},\ n = 1, \ldots N;\ j = 1 \ldots 2^N$$

$$\cong \frac{1}{\sigma_k^2}\left[x_k(s_{min}^{1,n} - s_{min}^{0,n}) - 0.5(s_{min2}^{1,n} - s_{min2}^{0,n})\right],$$

where $s_j^{1,n}$ stands for the j-th symbol in the ASK dimension that has bit value 1 in the n-th bit position. Similarly, $s_j^{0,n}$ represents the j-th symbol in the constellation that has bit value 0 in the n-th bit.

The same general processing method (including the normalization, equalization, scaling, limiting, and weighting of received symbols) described above for QPSK (4-QAM) can be used for CSI estimation of QPSK and QAM symbols, with a few differences in parameters. The normalized, equalized, and scaled QAM symbol, defined herein as constellation sample $x_k$ can be expressed as follows, where the general gain parameter g applies to QPSK (4-QAM), 16-QAM, or 64-QAM signals:

$$x_k = y_k \cdot \frac{g}{a} = y_k \cdot \frac{g \cdot a^*}{|a|^2}. \quad (3)$$

Figure 14:
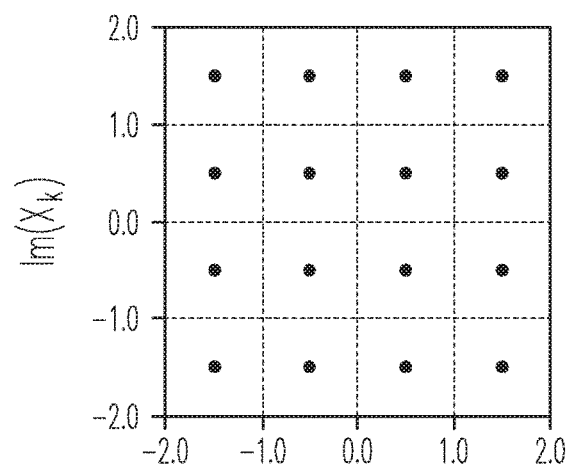
FIG. 14 is a plot showing constellation points on the unit grid spacing for a sixteen-point QAM (16-QAM) constellation.
Figure 15:
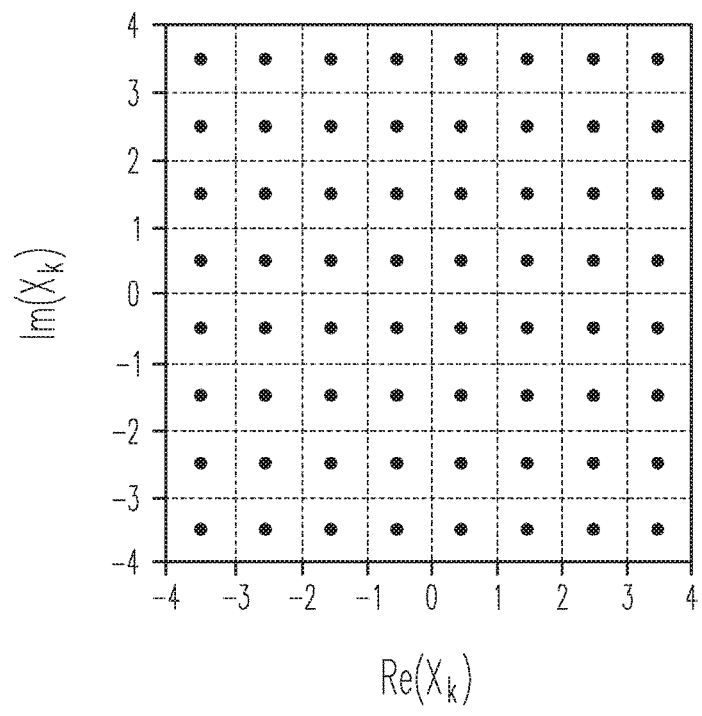
FIG. 15 is a plot showing constellation points on the unit grid spacing for a sixty-four point QAM (64-QAM) constellation.

For 16-QAM, a symbol scale factor of $g=\sqrt{5/2}$ is imposed on the normalized symbol to place the constellation samples on the unit grid spacing shown in FIG. 14. For 64-QAM, a symbol scale factor of $g=\sqrt{21/2}$ is imposed to place the constellation samples on the unit grid spacing shown in FIG. 15.

Figure 16A:
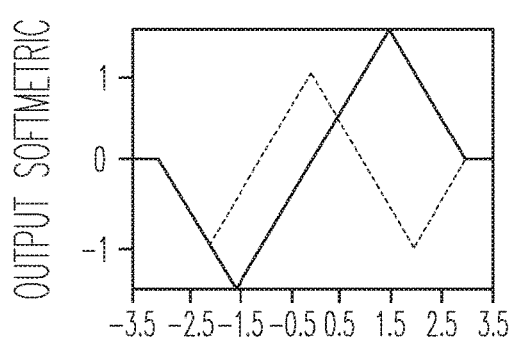
FIGS. 16A and 16B are plots of Soft 16-QAM Metric nonlinearities.
Figure 16B:
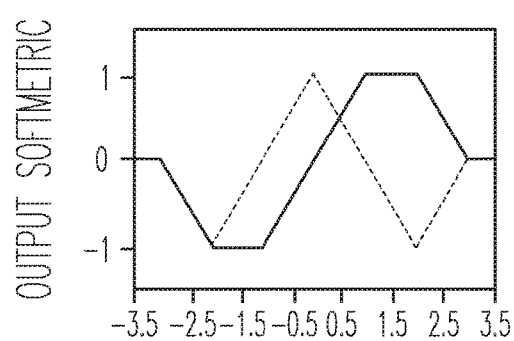
Figure 17A:
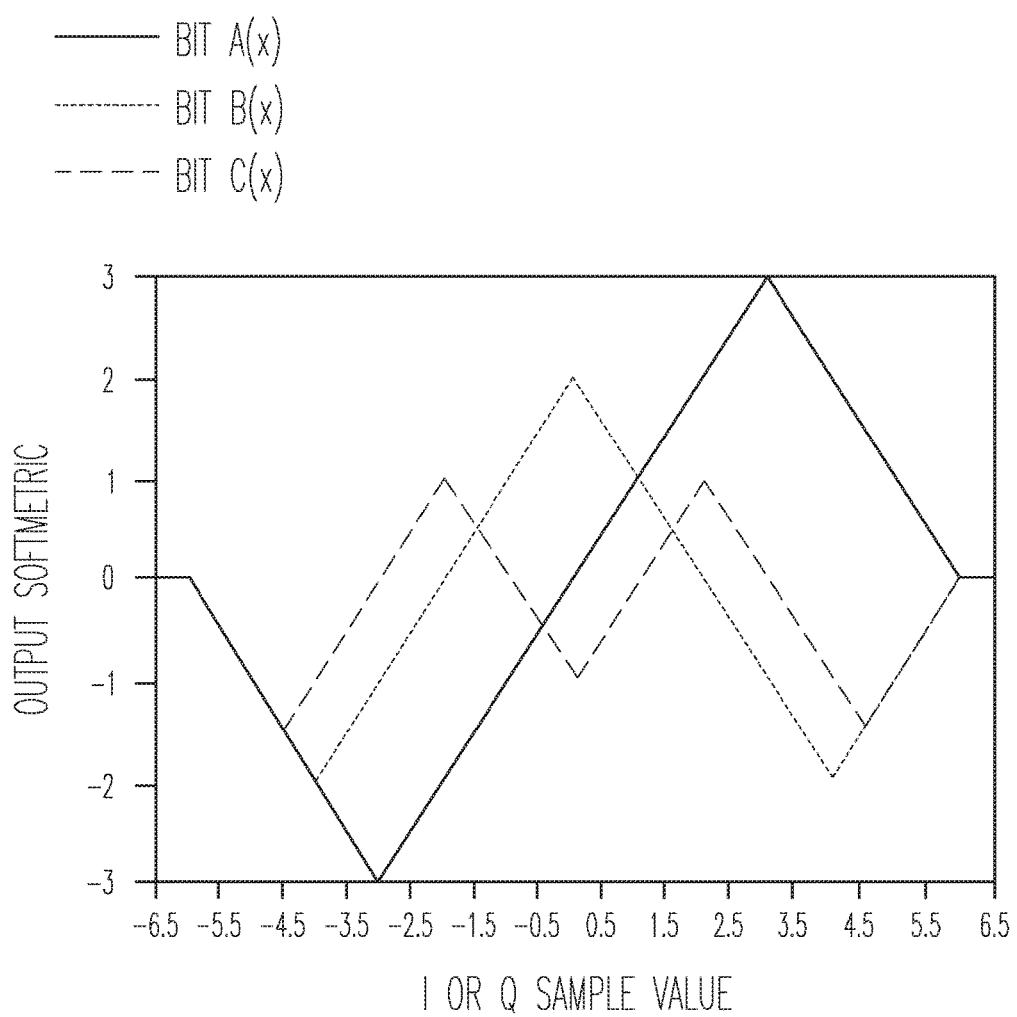
FIGS. 17A and 17B are plots of Soft 64-QAM Metric nonlinearities.
Figure 17B:
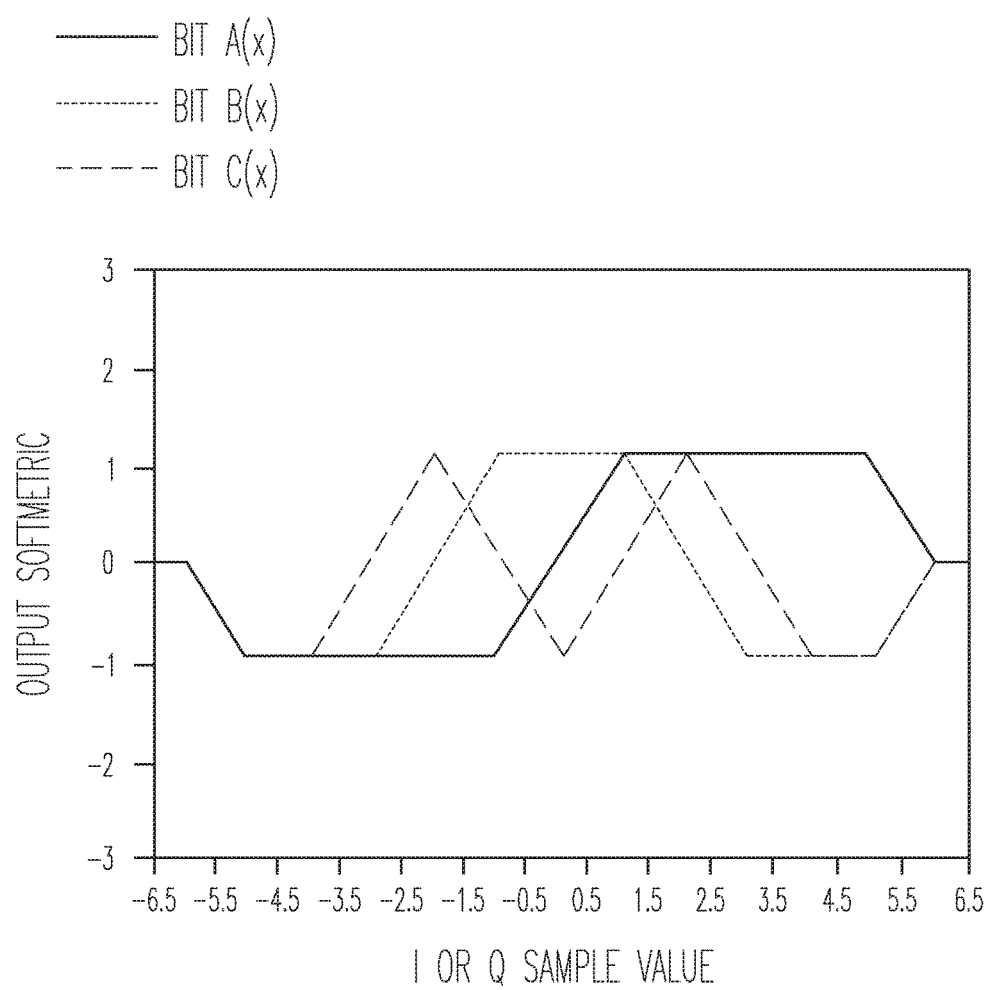

Limiting the constellation sample $x_k$ to improve performance in the presence of impulsive noise for 16-QAM and 64-QAM symbols is accomplished using a nonlinearity similar to that employed in the QPSK (4-QAM) case. The Soft QAM Metric nonlinearity derived from the QAM expression for the A (MSB) and B (LSB) bits in each dimension of the 16-QAM symbol is shown in FIGS. 16A and 16B. The Soft QAM Metric nonlinearity derived from the QAM expression for the A (MSB), B (XSB), and C (LSB) bits in each dimension of the 64-QAM symbol is shown in FIGS. 17A and 17B. The alternate metric nonlinearities offer slightly improved performance when the noise is more impulsive rather than Gaussian.

The QAM CSI weight $w_{QAM}$ is parameterized as a function of the scale factor g, which is different for each of the QAM symbol types. The soft QAM Metric nonlinearities shown in FIGS. 16A, 16B, 17A, and 17B have a slope of unity for convenience in defining a common grid spacing; however, this slope should be adjusted by a factor of 1/g for proper formulation of the LLR. A convenient way to accommodate this is to divide $w_{QPSK,modified}$ by $g \cdot \sqrt{2}$ as shown in the expression below, where the $\sqrt{2}$ factor maintains proper scaling compatibility with the QPSK weight.

$$w_{QAM} = \frac{w_{QPSK,modified}}{g \cdot \sqrt{2}} = \frac{4}{g^2 \cdot \sqrt{2}} \cdot \max\left\{0, \frac{|\hat{a}|^2}{\hat{\sigma}_{QPSK}^2} \cdot [\ln(2) + G \cdot 2^{-1/G}] - r_a\right\}. \quad (4)$$

The LLR λ may then be computed for the appropriate bits (A, B, and/or C) by passing $x_k$ through the soft QAM metric modifications of FIG. 13A or 13B, 16A or 16B, or 17A or 17B (depending on the modulation type), and multiplying the result by the QAM CSI weight, or $$\lambda_A = \text{bitA}(x_k) \cdot w_{QAM}$$

$$\lambda_B = \text{bitA}(x_k) \cdot w_{QAM}$$

$$\lambda_C = \text{bitA}(x_k) \cdot w_{QAM}. \quad (5)$$

Figure 18:
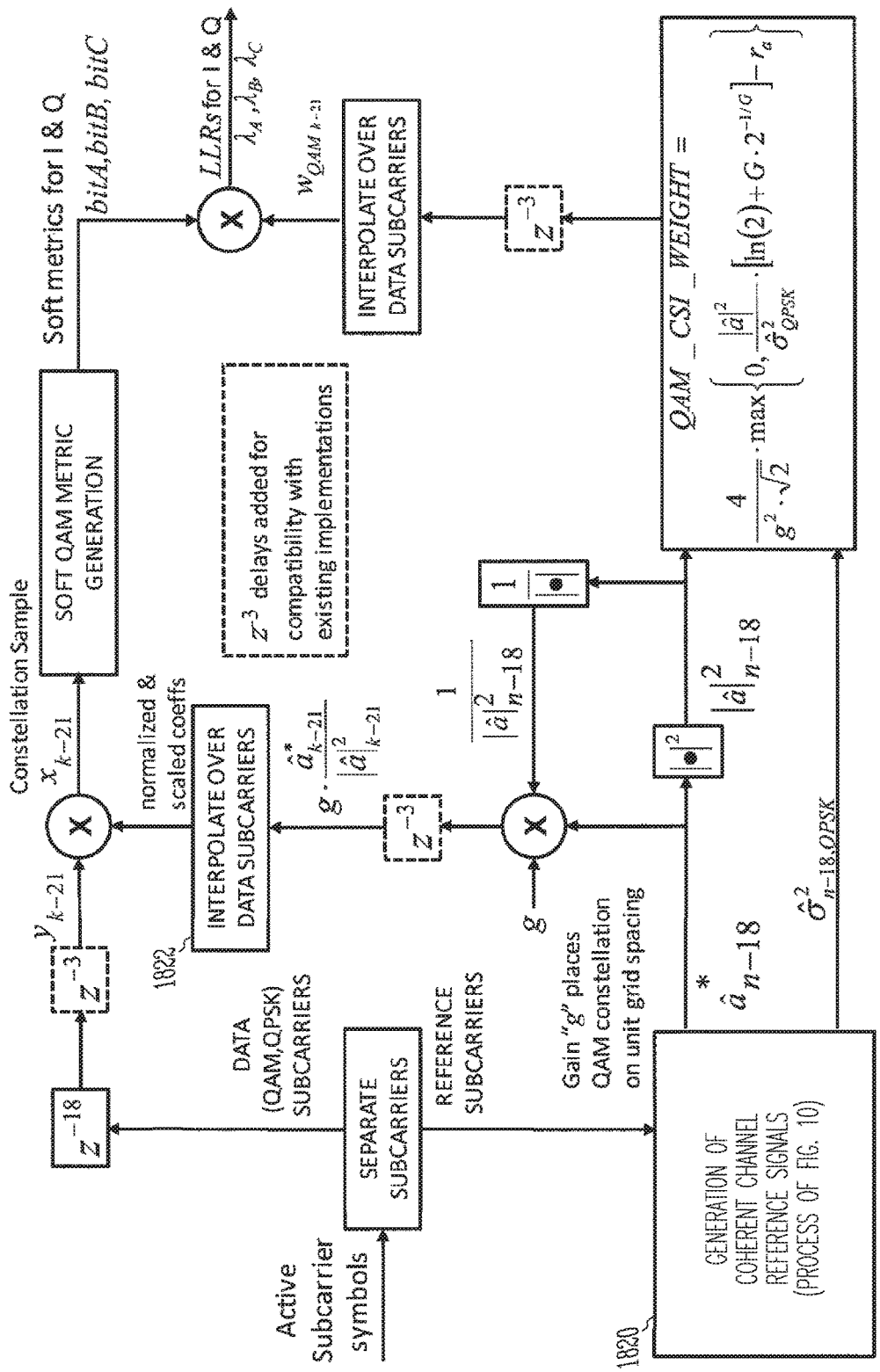
FIG. 18 is a functional block diagram of the log-likelihood ratio (LLR) generation for QPSK or QAM symbols.

FIG. 18 is a functional block diagram of the LLR metric generation for QPSK or QAM symbols. The estimation process example of FIG. 10 is represented by the box 1820 in the lower left. The normalization and scaling steps for signal estimation are shown prior to element 1822 labeled "INTERPOLATE OVER DATA SUBCARRIERS". In the example of FIG. 18, the modified QPSK CSI weight $w_{QPSK,modified}$ is replaced by the more general QAM CSI weight $w_{QAM}$.

Figure 19:
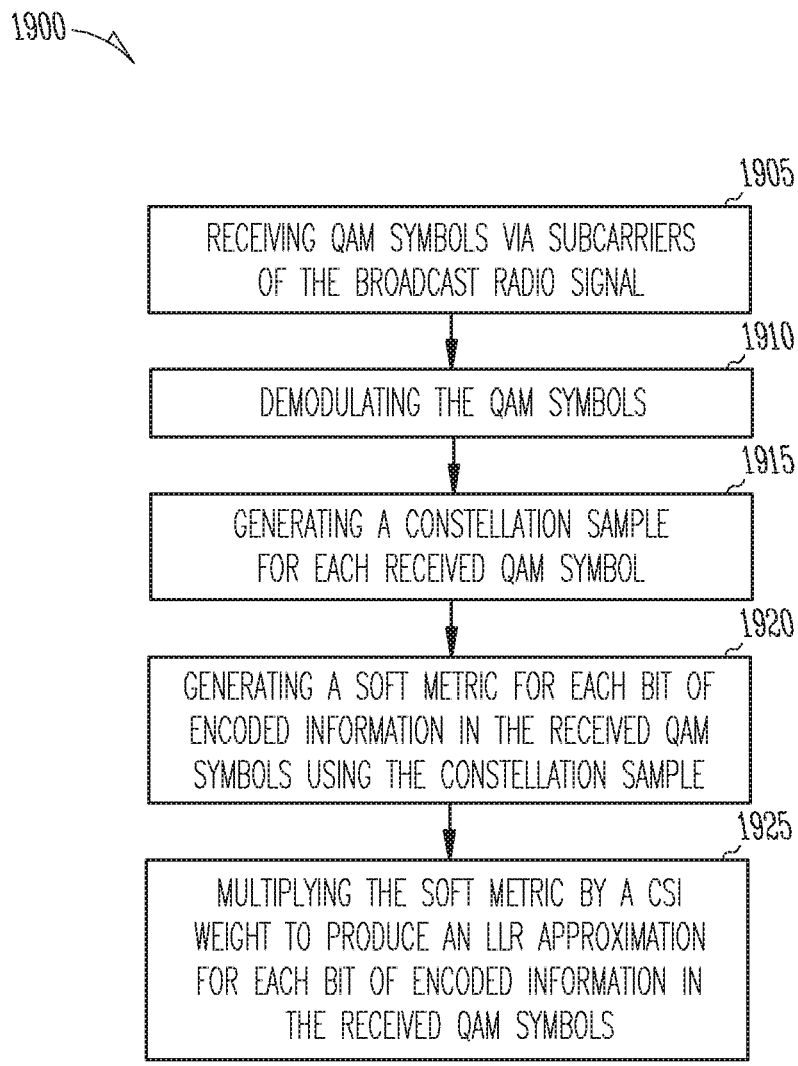
FIG. 19 is a flow diagram of a method of generating LLR approximations from a received broadcast radio signal.

FIG. 19 is a flow diagram of a method of generating LLR approximations from a received broadcast radio signal using CSI estimates. The method 1900 can be performed by processing circuitry of a radio receiver. At 1905, QAM symbols are received using the physical layer circuit, or layer one circuitry, of the radio receiver. The QAM symbols are received in subcarriers of the radio broadcast signal. The radio broadcast signal may be an in-band on-channel (IBOC) radio signal. The IBOC signal may be a hybrid of analog and digital radio signals, or may be an all-digital radio signal. The QAM symbols may be 4-QAM symbols, 16-QAM symbols, 64-QAM symbols, or other type of QAM symbols.

At 1910, the QAM symbols are demodulated, and at 1915, a constellation sample is generated for each received QAM symbol. In some embodiments, the constellation sample is computed using Equation (3) above. At 1920, a soft metric is generated for each bit of encoded information of the received QAM symbols using the constellation sample. In some embodiments, a nonlinearity is used to modify the constellation sample to generate the soft metric of the received symbol. The nonlinearity used can be selected according to the type of QAM used for the symbols. The generated soft metric includes a number of bits determined according to the QAM type. In the examples of FIGS. 13A, 13B, 16A, 16B. 17A, and 17B, the generated soft metric includes one, two, or three bits depending on whether the type of modulation is 4-QAM, 16-QAM, or 64-QAM.

At 1925, the soft metric is multiplied by a CSI weight to produce an LLR approximation for each bit of encoded information of the received QAM symbols. In some embodiments, the LLR is determined using Equation (5) above. The CSI weight can be determined using Equation (4) above, and the CSI weight can include one or both of a symbol noise variance bias-corrected for error introduced by the CSI estimation, and a magnitude-squared channel gain bias-corrected for error introduced by the CSI estimation.

LLR Scaling and Quantization

Figure 20:
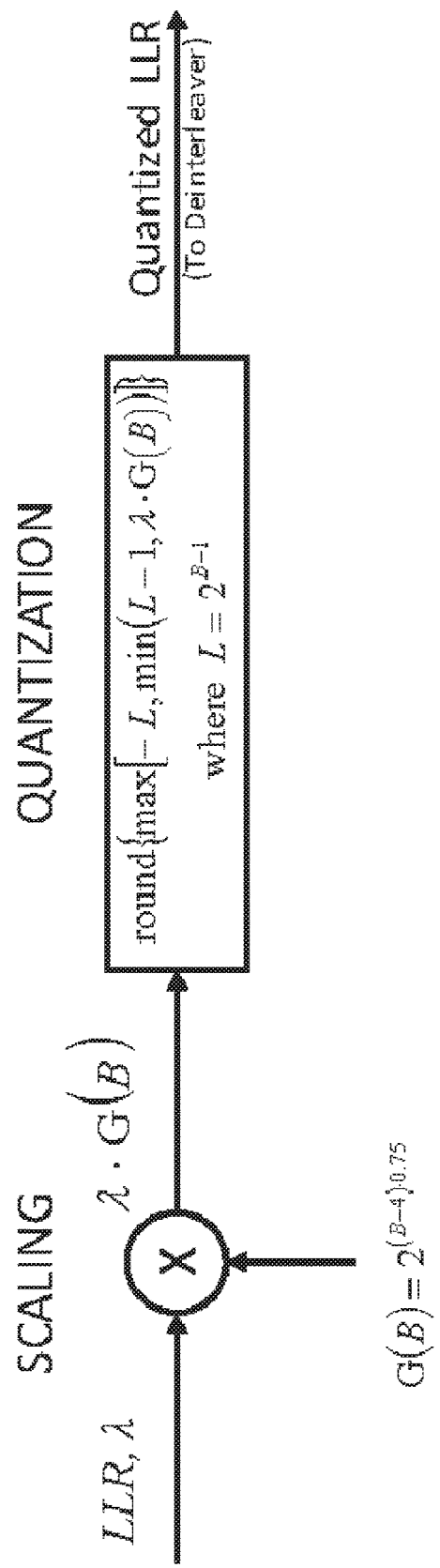
FIG. 20 is a functional block diagram of scaling and quantization of LLRs.

The generated LLR metric outputs shown in FIG. 18 can be deinterleaved in a memory buffer prior to processing by the Viterbi decoder to recover the source information of the received symbols. FIG. 20 is a functional block diagram of scaling and quantization of LLRs prior to deinterleaving to reduce deinterleaver memory requirements. Viterbi decoding performance can be maximized by appropriate scaling prior to fixed-point quantization using the processing shown in FIG. 20.

The expected value of the magnitude of the LLR metrics can be approximated by twice the SNR of the corresponding symbol, or $$E\{|\lambda|\} \cong E\left\{\left|y \cdot \frac{2 \cdot \alpha}{\sigma^2}\right|\right\} = 2 \cdot \frac{|\alpha|^2}{\sigma_k^2} = 2 \cdot SNR,$$

where SNR is defined here as the ratio of the symbol energy to the noise variance. Therefore, the LLR values are expressed in units of SNR/2. Conveniently, this happens to be the generally recommended step size for metric quantizers with the number of quantization bits B equal to four, or (B=4 bits). Hence, scaling the input to the quantizer is not needed when B=4.

When the quantizer uses more than four bits, the extra quantization levels can be used to both decrease the step size and increase the range of the LLR metric. The scaling gain G and the quantization step size Q can be functions of the number of bits used in quantization. An expression for determining quantization, which sets the gain to unity when B=4, is $$G(B)=2^{(B-4) \cdot 0.75}.$$

The scaling gain G(B) and resulting quantization step size Q(B)=1/[2·G(B)] over a range of B are presented in Table 3.

TABLE 3

Scaling Gain G(B) and Quantization Step Size Q(B) as Functions of B

| B | 2 | 3 | 4 | 5 | 6 | 7 | 8 |
|---|---|---|---|---|---|---|---|
| G(B) | 0.354 | 0.595 | 1 | 1.682 | 2.828 | 4.757 | 8 |
| Q(B) | 1.414 | 0.841 | 0.5 | 0.297 | 0.177 | 0.105 | 0.063 |

The range of a quantized two's-complement integer is asymmetric over $[-2^{B-1}, 2^{B-1}-1]$. Although some metric quantizers add 0.5 to the metric interpretation to assure symmetry, it is not recommended in cases where some bits may be punctured or erased to zero. A one-bit, or "hard-decision" quantizer may simply use the sign (polarity) of the LLR. The scaled and quantized LLR metrics can be provided to the deinterleaving buffering prior to processing by the Viterbi decoding circuitry.

Figure 13B:
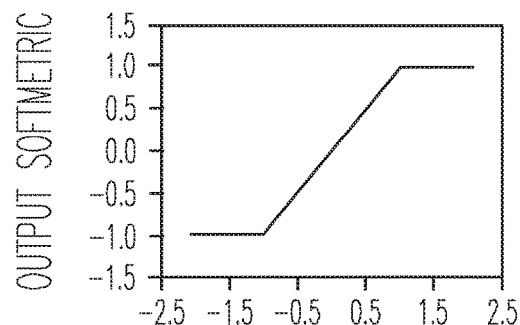

According to some embodiments, determining the LLR metrics includes using the nonlinearity of FIGS. 13B, 16B, and 17B when generating the soft metrics. This simplifies the processing for quantization because the outputs of these nonlinearities are limited to ±1 so the full-scale fixed-point integers span the same range. In some embodiments, the scaling of the QAM constellation by scaling factor "g" can be eliminated by incorporating the scaling into the nonlinearites of FIGS. 13A, 13B, 16A, 16B, 17A, and 17B. The scaling can be incorporated into the x-axis of the nonlinearites for equivalent computation.

The described methods and devices improve calculations of channel state information or statistics. These improvements can provide increased robustness in the presence of noise, and/or increased capacity for subcarriers of a broadcast radio signal such as an IBOC radio signal.

Additional Examples and Disclosure

Example 1 includes subject matter (such as a radio receiver) comprising physical layer circuitry and processing circuitry. The physical layer circuitry is configured to receive quadrature amplitude modulation (QAM) symbols via a plurality of subcarriers included in a broadcast radio signal, wherein each received QAM symbol is a complex symbol comprising multiple bits of encoded source information. The processing circuitry is configured to demodulate the received data symbols; generate a constellation sample for each received QAM symbol; generate a soft metric for each bit of encoded information in the received QAM symbols using the constellation sample; and multiply the soft metric by a channel state information (CSI) weight to produce a Log-likelihood Ratio (LLR) approximation for each bit of encoded information in the received QAM symbols.

In Example 2, the subject matter of Example 1 optionally includes processing circuitry configured to multiply the soft metric by a CSI weight that includes a bias-corrected ratio of a determined magnitude-squared channel gain and a determined symbol noise variance.

In Example 3, the subject matter of Example 2 optionally includes a bias-corrected ratio that includes a symbol noise variance bias-corrected for error introduced by CSI estimation.

In Example 4, the subject matter of one or both of Examples 2 and 3 optionally includes a bias corrected ratio that includes a symbol noise variance bias-corrected for error due to determining the symbol noise variance using a median-filtered estimate of the symbol noise variance.

In Example 5, the subject matter of one or any combination of Examples 2-4 optionally includes processing circuitry configured to perform CSI noise variance estimation using an excess noise feedforward path when an excess noise level is present in the QAM symbol sample, wherein the excess noise feedforward path scales the noise variance estimate by an excess noise feedforward path gain; and wherein the bias-corrected ratio includes a symbol noise variance bias-corrected for a bias error introduced by the excess noise feedforward path.

In Example 6, the subject matter of one or any combination of Examples 2-5 optionally includes a bias-corrected ratio that includes an estimated magnitude-squared channel gain bias-corrected for error introduced by CSI estimation.

In Example 7, the subject matter of one or any combination of Examples 1-6 optionally includes processing circuitry configured to determine the complex soft metric of a received QAM symbol by modifying a constellation sample of a received QAM symbol using a soft QAM metric nonlinearity specified according to a QAM modulation type of the received QAM symbol, wherein the soft QAM metric nonlinearity limits the value of the soft metric for each bit component of the received QAM symbol.

In Example 8, the subject matter of Example 7 optionally includes modifying the constellation sample of a received QAM symbol using a soft QAM metric nonlinearity that reduces the value of the soft metric for each bit component of the received QAM symbol.

In Example 9, the subject matter of one or both of Examples 7 and 8 optionally includes processing circuitry configured to select a first soft QAM metric nonlinearity to modify the value of the soft metric for each bit component of the constellation sample when the QAM modulation includes four point QAM (4-QAM); select a second soft QAM metric nonlinearity to modify the value of the soft metric for each bit component of the constellation sample when the QAM modulation includes sixteen point QAM (16-QAM); and select a third soft QAM metric nonlinearity to modify the value of the soft metric for each bit component of the constellation sample when the QAM modulation includes sixty-four point QAM (64-QAM).

Example 10 includes subject matter (such as a radio receiver), or can optionally be combined with one or any combination of Examples 1-9 to include such subject matter, comprising physical layer circuitry and processing circuitry. The physical layer circuitry is configured to receive quadrature amplitude modulation (QAM) symbols via a plurality of subcarriers included in a broadcast radio signal, wherein each received QAM symbol is a complex symbol comprising multiple bits of encoded source information. The processing circuitry is configured to: determine Log-likelihood Ratio (LLR) metric values for the received QAM symbols; scale the LLR metric values using an LLR scaling gain to produce scaled LLR metric values, wherein the LLR scaling gain is a function of a number of bits of quantization for a binary LLR value of the determined LLR metric values; quantize the scaled LLR metric values to produce quantized scaled LLR metric values, wherein a step size of the quantization is a function of the number of bits of quantization; and decode a received QAM symbol using the quantized scaled LLR metric values.

In Example 11, the subject matter of Example 10 optionally includes processing circuitry configured to: demodulate a received QAM symbol; generate a constellation sample for the received QAM symbol; generate a soft metric for each bit of encoded information in the received QAM symbol using the constellation sample; and multiply the soft metric by a channel state information (CSI) weight to produce an LLR metric value for each bit of encoded information in the received QAM symbols.

Example 12 includes subject matter (such as a method of generating LLR approximations from a broadcast radio signal, a means for performing acts, or a machine-readable medium including instructions that, when performed by the machine, cause the machine to perform acts), or can optionally be combined with the subject matter of one or any combination of Examples 1-11 to include such subject matter, comprising receiving quadrature amplitude modulation (QAM) symbols via subcarriers of the broadcast radio signal and demodulating the QAM symbols, wherein each received QAM symbol is a complex symbol comprising multiple bits of encoded source information; generating a constellation sample for each received QAM symbol; generating a soft metric for each bit of encoded information in the received QAM symbols using the constellation sample; and multiplying the soft metric by a CSI weight to produce an LLR approximation for each bit of encoded information in the received QAM symbols.

In Example 13, the subject matter of Example 12 optionally includes multiplying the soft metric by a CSI weight that includes a bias-corrected ratio of a determined magnitude-squared channel gain and a determined symbol noise variance.

In Example 14, the subject matter of Example 13 optionally includes the bias-corrected ratio including a symbol noise variance bias-corrected for error introduced by CSI estimation.

In Example 15, the subject matter of one or both of Examples 13 and 14 optionally includes the bias-corrected ratio including a symbol noise variance bias-corrected for error due to determining the symbol noise variance using a median-filtered estimate of the symbol noise variance.

In Example 16, the subject matter of one or both of Examples 14 and 15 optionally includes estimating the noise variance of a QAM symbol sample using excess noise feedforward path processing when an excess noise level is present in the QAM symbol sample, wherein the excess noise feedforward path scales the estimated noise variance by an excess noise feedforward path gain; and wherein the bias-corrected ratio includes a symbol noise variance bias-corrected for a bias error introduced by the excess noise feedforward path processing.

In Example 17, the subject matter of one or any combination of Examples 13-16 optionally includes the bias-corrected ratio including an estimated magnitude-squared channel gain bias-corrected for error introduced by CSI estimation.

In Example 18, the subject matter of one or any combination of Examples 12-17 optionally includes modifying a constellation sample of a received QAM symbol using a soft QAM metric nonlinearity specified according to a QAM modulation type of the received QAM symbol.

In Example 19, the subject matter of Example 18 optionally includes selecting a first soft QAM metric nonlinear function to modify the value of the soft metric for each bit component of the constellation sample when channel noise includes more Gaussian noise than impulsive noise; and selecting a second soft QAM metric nonlinear function to modify the value of the soft metric for each bit component of the constellation sample when the channel noise includes more impulsive noise than Gaussian noise.

In Example 20, the subject matter of one or any combination of Examples 12-19 optionally includes scaling a produced LLR approximation using an LLR scaling gain to produce a scaled LLR metric value, wherein the scaling gain is a function of a number of bits of quantization for a binary LLR value of the produced LLR approximation; quantizing the scaled LLR metric value to produce a quantized scaled LLR metric value, wherein a step size of the quantization is a function of the number of bits of quantization; and decoding a received QAM symbol using the quantized scaled LLR metric value.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, the subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope should be determined with reference to the appended claims, along with the full scope of equivalents to which such claims are entitled.

What is claimed is:

1. A radio receiver comprising:
   physical layer circuitry configured to receive quadrature amplitude modulation (QAM) symbols via a plurality of subcarriers included in a broadcast radio signal, wherein each received QAM symbol is a complex symbol comprising multiple bits of encoded source information;
   processing circuitry configured to:
      demodulate the received data symbols;
      generate a constellation sample for each received QAM symbol;
      generate a soft metric for each bit of encoded information in the received QAM symbols using the constellation sample;
      select, according to a QAM modulation type of the received QAM symbol, a soft QAM metric nonlinearity to modify the value of the soft metric for each bit component of the constellation sample; and
      multiply the modified soft metric by a channel state information (CSI) weight to produce a Log-likelihood Ratio (LLR) approximation for each bit of encoded information in the received QAM symbols.

2. The radio receiver of claim 1, wherein the processing circuitry is configured to multiply the soft metric by a CSI weight that includes a bias-corrected ratio of a determined magnitude-squared channel gain and a determined symbol noise variance.

3. The radio receiver of claim 2, wherein the bias-corrected ratio includes a symbol noise variance bias-corrected for error introduced by CSI estimation.

4. The radio receiver of claim 3, wherein the bias-corrected ratio includes a symbol noise variance bias-corrected for error due to determining the symbol noise variance using a median-filtered estimate of the symbol noise variance.

5. The radio receiver of claim 3, wherein the processing circuitry is configured to perform CSI noise variance estimation using an excess noise feedforward path when an excess noise level is present in the QAM symbol sample, wherein the excess noise feedforward path scales the noise variance estimate by an excess noise feedforward path gain; and
   wherein the bias-corrected ratio includes a symbol noise variance bias-corrected for a bias error introduced by the excess noise feedforward path.

6. The radio receiver of claim 2, wherein the bias-corrected ratio includes an estimated magnitude-squared channel gain bias-corrected for error introduced by CSI estimation.

7. The radio receiver of claim 1, wherein the processing circuitry is configured to determine a complex soft metric of a received QAM symbol by modifying a constellation sample of a received QAM symbol using the soft QAM metric nonlinearity, wherein the soft QAM metric nonlinearity limits the value of the soft metric for each bit component of the received QAM symbol.

8. The radio receiver of claim 7, wherein the soft QAM metric nonlinearity reduces the value of the soft metric for each bit component of the received QAM symbol.

9. The radio receiver of claim 7, wherein the processing circuitry is configured to:
   select a first soft QAM metric nonlinearity to modify the value of the soft metric for each bit component of the constellation sample when the QAM modulation includes four point QAM (4-QAM);
   select a second soft QAM metric nonlinearity to modify the value of the soft metric for each bit component of the constellation sample when the QAM modulation includes sixteen point QAM (16-QAM); and
   select a third soft QAM metric nonlinearity to modify the value of the soft metric for each bit component of the constellation sample when the QAM modulation includes sixty-four point QAM (64-QAM).

10. A radio receiver comprising:
    physical layer circuitry configured to receive quadrature amplitude modulation (QAM) symbols via a plurality of subcarriers included in a broadcast radio signal, wherein each received QAM symbol is a complex symbol comprising multiple bits of encoded source information;
    processing circuitry configured to:
       generate a soft metric for each bit of encoded information in the received QAM symbols using a constellation sample generated for each received QAM symbol;

select a soft QAM metric nonlinearity to modify the value of the soft metric for each bit component of the constellation sample;

determine Log-likelihood Ratio (LLR) metric values for the received QAM symbols using modified values of the generated soft metrics;

scale the LLR metric values using an LLR scaling gain to produce scaled LLR metric values, wherein the LLR scaling gain is a function of a number of bits of quantization for a binary LLR value of the determined LLR metric values;

quantize the scaled LLR metric values to produce quantized scaled LLR metric values, wherein a step size of the quantization is a function of the number of bits of quantization; and decode a received QAM symbol using the quantized scaled LLR metric values.

11. The radio receiver of claim 10, wherein the processing circuitry is configured to:

multiply the soft metric by a channel state information (CSI) weight to produce an LLR metric value for each bit of encoded information in the received QAM symbols.

12. A method of generating Log-likelihood Ratio (LLR) approximations from a broadcast radio signal using channel state information (CSI) estimates, the method comprising:

receiving quadrature amplitude modulation (QAM) symbols via subcarriers of the broadcast radio signal and demodulating the QAM symbols, wherein each received QAM symbol is a complex symbol comprising multiple bits of encoded source information;

generating a constellation sample for each received QAM symbol;

generating a soft metric for each bit of encoded information in the received QAM symbols using the constellation sample;

selecting, according to a QAM modulation type of the received QAM symbol, a soft QAM metric nonlinearity to modify the value of the soft metric for each bit component of the constellation sample; and multiplying the modified soft metric by a CSI weight to produce an LLR approximation for each bit of encoded information in the received QAM symbols.

13. The method of claim 12, wherein multiplying the soft metric by the CSI weight includes multiplying the soft metric by a CSI weight that includes a bias-corrected ratio of a determined magnitude-squared channel gain and a determined symbol noise variance.

14. The method of claim 13, wherein the bias-corrected ratio includes a symbol noise variance bias-corrected for error introduced by CSI estimation.

15. The method of claim 14, wherein the bias-corrected ratio includes a symbol noise variance bias-corrected for error due to determining the symbol noise variance using a median-filtered estimate of the symbol noise variance.

16. The method of claim 14, wherein the CSI estimation includes estimating the noise variance of a QAM symbol sample using excess noise feedforward path processing when an excess noise level is present in the QAM symbol sample, wherein the excess noise feedforward path scales the estimated noise variance by an excess noise feedforward path gain; and wherein the bias-corrected ratio includes a symbol noise variance bias-corrected for a bias error introduced by the excess noise feedforward path processing.

17. The method of claim 13, wherein the bias-corrected ratio includes an estimated magnitude-squared channel gain bias-corrected for error introduced by CSI estimation.

18. The method of claim 12, wherein generating the soft metric for each received QAM symbol includes modifying the constellation sample of a received QAM symbol using the soft QAM metric nonlinearity, wherein the soft QAM metric nonlinearity is specified according to the QAM modulation type of the received QAM symbol, wherein the soft QAM metric nonlinearity limits the value of the soft metric for each bit component of the received QAM symbol.

19. The method of claim 18, wherein modifying a constellation sample of a received QAM symbol includes:

selecting a first soft QAM metric nonlinear function to modify the value of the soft metric for each bit component of the constellation sample when channel noise includes more Gaussian noise than impulsive noise; and selecting a second soft QAM metric nonlinear function to modify the value of the soft metric for each bit component of the constellation sample when the channel noise includes more impulsive noise than Gaussian noise.

20. The method of claim 12, further including:

scaling a produced LLR approximation using an LLR scaling gain to produce a scaled LLR metric value, wherein the scaling gain is a function of a number of bits of quantization for a binary LLR value of the produced LLR approximation;

quantizing the scaled LLR metric value to produce a quantized scaled LLR metric value, wherein a step size of the quantization is a function of the number of bits of quantization; and decoding a received QAM symbol using the quantized scaled LLR metric value.

* * * * *